(12) United States Patent
Gorbachov

(10) Patent No.: US 9,054,653 B2
(45) Date of Patent: Jun. 9, 2015

(54) ON-DIE HARMONICS FILTERING FOR RADIO FREQUENCY POWER AMPLIFIERS

(71) Applicant: RFAXIS, INC., Irvine, CA (US)

(72) Inventor: Oleksandr Gorbachov, Irvine, CA (US)

(73) Assignee: RFAXIS, INC., Irvine, CA (US)

( * ) Notice: Subject to any disclaimer, the term of this patent is extended or adjusted under 35 U.S.C. 154(b) by 0 days.

(21) Appl. No.: 14/152,321

(22) Filed: Jan. 10, 2014

(65) Prior Publication Data

US 2014/0197892 A1   Jul. 17, 2014

Related U.S. Application Data

(60) Provisional application No. 61/751,458, filed on Jan. 11, 2013.

(51) Int. Cl.
| | |
|---|---|
| *H03F 1/08* | (2006.01) |
| *H03F 1/34* | (2006.01) |
| *H03F 3/19* | (2006.01) |
| *H03F 3/21* | (2006.01) |

(52) U.S. Cl.
CPC .. *H03F 1/34* (2013.01); *H03F 3/19* (2013.01); *H03F 3/21* (2013.01); *H03F 2200/108* (2013.01); *H03F 2200/121* (2013.01); *H03F 2200/492* (2013.01)

(58) Field of Classification Search
USPC .......................................... 330/293, 302, 306
IPC .......................................................... H03F 1/08
See application file for complete search history.

(56) References Cited

U.S. PATENT DOCUMENTS

| | | | | |
|---|---|---|---|---|
| 5,508,663 | A  * | 4/1996 | Konno | 330/10 |
| 5,969,575 | A  * | 10/1999 | Helms | 330/294 |
| 7,276,962 | B1 * | 10/2007 | Tomasi | 330/9 |
| 2008/0218271 | A1* | 9/2008 | Mitzlaff et al. | 330/298 |
| 2009/0195316 | A1* | 8/2009 | Park et al. | 330/277 |
| 2013/0049735 | A1* | 2/2013 | Shafer et al. | 324/76.11 |

* cited by examiner

*Primary Examiner* — Patricia T Nguyen
(74) *Attorney, Agent, or Firm* — Stetina Brunda Garred & Brucker

(57) ABSTRACT

A power amplifier architecture for connecting a radio frequency (RF) transceiver to an antenna. An input matching circuit is connected to its input port, and an output matching circuit is connected to its output port. An amplifier circuit includes at least one amplifier active device with a first terminal connected to the input matching segment and a second terminal connected to the output matching segment. A first harmonic feedback circuit is connected across the amplifier active device. Voltage components of emissions of one or more harmonic frequencies of a carrier fundamental frequency generated by the amplifier active device is fed back with opposite phase to the first terminal of the amplifier active device. A negative feedback is defined at a level correlated with a gain level of the amplifier active device at the harmonic frequencies of the carrier fundamental frequency. Negative feedback is minimized at the carrier fundamental frequency.

29 Claims, 22 Drawing Sheets

ON-DIE HARMONICS FILTERING FOR RADIO FREQUENCY POWER AMPLIFIERS

CROSS-REFERENCE TO RELATED APPLICATIONS

This application relates to and claims the benefit of U.S. Provisional Application No. 61/751,458, filed Jan. 11, 2013 and entitled ON-DIE HARMONICS FILTER FOR RADIO FREQUENCY POWER AMPLIFIERS, the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) signal circuitry, and more particularly, to on-die harmonics filtering for RF power amplifiers.

2. Related Art

Wireless communications systems find application in numerous contexts involving data transfer over long and short distances alike, and there exists a wide range of modalities suited to meet the particular needs of each. Chief amongst these systems with respect to popularity and deployment is the mobile or cellular phone, and it has been estimated that there are over 4.6 billion subscriptions worldwide.

Generally, wireless communications involve a radio frequency (RF) carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System). Various generations of these technologies exist and are deployed in phases, with one common third generation (3G) UMTS-related modality referred to as UMTS-FDD (frequency division duplexing) being W-CDMA (Wideband Code Division Multiplexing). Besides mobile communications modalities such as these, mobile phones also incorporate local area data networking modalities such as Wireless LAN, or WLAN (IEEE 802.11x).

A fundamental component of any wireless communications system is the transceiver, that is, the combined transmitter and receiver circuitry. The transceiver encodes the data to a baseband signal and modules it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

Conventional mobile handset transceivers typically do not generate sufficient power or have sufficient sensitivity for reliable communications standing alone. Thus, additional conditioning of the RF signal at both the transmission end and the reception end is necessary. The circuitry between the transceiver and the antenna that provide this functionality is referred to as the front-end module, which includes a power amplifier for increased transmission power, and/or a low noise amplifier for increased reception sensitivity. Depending on the link distance and selected quality of service levels, the RF carrier signal is amplified to the designated level, and delivered to the antenna.

In general, a communications link is established when both the transmission and reception of a signal are in accordance with mutual parameters, with one such parameter in the case of wireless RF communications being the carrier frequency. Emissions outside the established carrier frequency are unnecessary and indeed undesirable, as they have the potential to interfere with other wireless systems. Moreover, there are regulatory requirements that govern the acceptable emission levels of signals outside of the carrier frequency to ensure that different communications devices can co-exist and function properly within the same vicinity. The highest power of unwanted signals at the RF power amplifier is typically generated at the harmonic frequencies of the carrier signal fundamental frequency, which is primarily attributable to the non-linear response of the active devices (e.g., transistors) used for amplification. For example, with a typical RF power amplifier operating in the 2.4-2.5 GHz ISM (Industrial Scientific Medical) band at relatively high power levels of greater than 20 dBm, which is characteristic of WiFi, Bluetooth, and ZigBee wireless communications modalities, the power levels of the harmonic frequency emissions can exceed United States Federal Communications Commission limits of −41.3 dBm by over 40 dB at the third harmonic frequency, and by over 50 dB at the second harmonic frequency.

Conventional RF power amplifiers thus incorporate harmonic filters to minimize the level of undesirable emissions. One possible way to reduce harmonic emissions is by way of a low-pass filter that rejects all frequencies above the fundamental frequency, while another possibility is a notch filter that rejects only certain harmonics as defined by the particular communications standard. In order for the filter to be able to reject high levels of harmonic frequencies, components having low loss such as capacitors and inductors are utilized. However, implementation of harmonics filters in integrated circuits is challenging because of the significant losses associated therewith, particularly as they relate to metal and substrate losses. Furthermore, because of the large footprint of inductors in integrated circuits, the overall cost can be substantially increased.

Accordingly, there is a need in the art for improved on-die harmonics filtering for RF power amplifiers. There is also a need for such harmonics reduction to be implemented without inductors to overcome the aforementioned issues associated therewith and more.

BRIEF SUMMARY

Various embodiments of the present disclosure contemplate a power amplifier architecture for connecting a radio frequency (RF) transceiver to an antenna. The transceiver generates an RF signal defined by a carrier fundamental frequency. The power amplifier architecture includes an input matching circuit that is connected to its input port, as well as an output matching circuit connected to its output port. There may also be an amplifier circuit that includes at least one amplifier active device with a first terminal connected to the input matching segment and a second terminal connected to the output matching segment. Furthermore, there may be a first harmonic feedback circuit that is connected across the amplifier active device. Voltage components of emissions of one or more harmonic frequencies of the carrier fundamental frequency generated by the amplifier active device may be fed back with opposite phase to the first terminal of the amplifier active device by the first harmonic feedback circuit. A negative feedback may be defined at a level correlated with a gain level of the amplifier active device at the one or more harmonic frequencies of the carrier fundamental frequency. Furthermore, the negative feedback is minimized at the carrier fundamental frequency.

According to one embodiment, the first harmonic feedback circuit may include a passive harmonics phase shift component, a control voltage source, and a bias voltage source. Additionally, the first harmonic feedback circuit may include a first feedback active device that has a first terminal connected to the control voltage source, a second terminal connected to the bias voltage source and the passive harmonics phase shift component, and a third terminal connected to the first terminal of the amplifier active device. The first feedback active device, together with the passive harmonics phase shift component, the control voltage source, and the supply voltage source are tuned to shift the emissions of the one or more harmonic frequencies of the carrier fundamental frequency to the opposite phase. In another embodiment, the first harmonic feedback circuit may include a first passive gain shaping component that is connected to the first terminal of the first feedback active device and the second terminal of the first feedback active device. An alternative embodiment contemplates a second passive gain shaping component connected to the second terminal of the first feedback active device and the third terminal of the first feedback active device. Still yet another embodiment contemplates a combination of the two, that is, a first passive gain shaping component and a first passive gain shaping component.

Emission of harmonics can be reduced in power amplifier circuits with the contemplated power amplifier architectures without the necessity of printed on-die inductors, which reduces the overall footprint of the front end integrated circuit. This is also contemplated to reduce its production costs. The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The present disclosure contemplates various radio frequency (RF) front ends, particularly power amplifiers and related circuitry for harmonics filtering over a wide frequency range and high rejection characteristics. The detailed description set forth below in connection with the appended drawings is intended as a description of the presently preferred embodiments of these circuits, and is not intended to represent the only form in which they may be developed or utilized. The description sets forth the functions in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
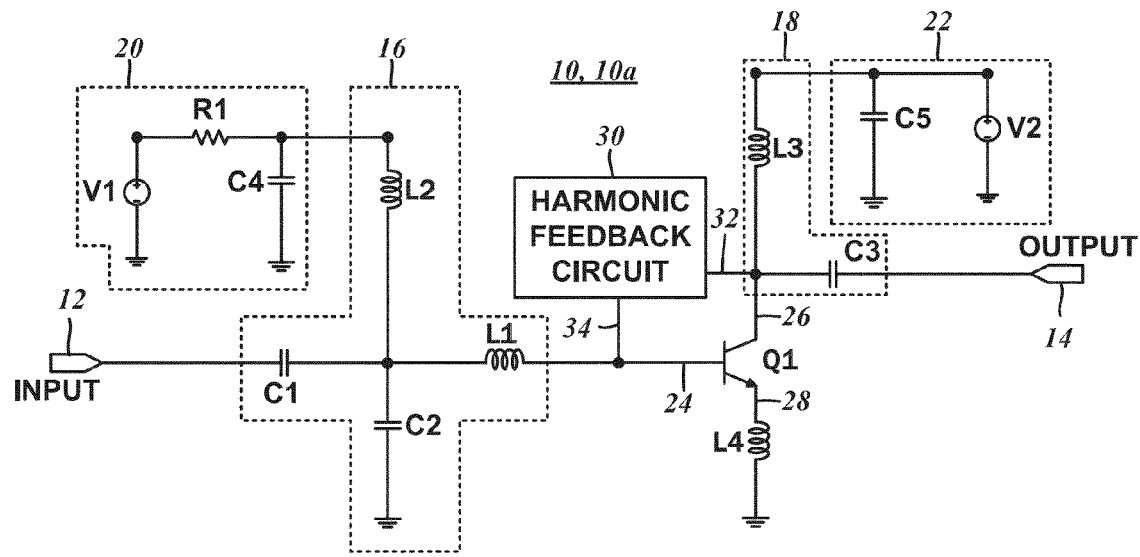
FIG. 1 is a schematic diagram of an exemplary power amplifier circuit including a harmonic feedback circuit in accordance with various embodiments of the present disclosure.

The schematic diagram of FIG. 1 depicts a first embodiment of an RF power amplifier 10a in accordance with the present disclosure. When referring to the RF power amplifier in the general sense as applicable to all of the contemplated embodiments, the numeral 10 will be used, though when referring to any particular embodiment and the features contemplated therein, the secondary alphabetical identifier will be used. The components of the RF power amplifier 10 have been simplified, and it will be appreciated by those having ordinary skill in the art that the features specifically depicted in FIG. 1 and the other drawings are not the only ones typically incorporated into an actual implementation of power amplifier circuits. Along these lines, in typical implementations there may be multiple ones of components, such as transistors configured in multiple amplification stages.

As a general matter, the RF power amplifier 10 is typically defined by an input port 12 that is connected to an output of a RF transceiver (not shown), and an output port 14 that is connected to an antenna (not shown). The RF transceiver generates a transmission signal that is comprised of a baseband signal modulated on to an RF carrier signal. The various examples and circuit simulation results included herein are considered in terms of a carrier signal in the 2.4 to 2.5 GHz ISM band, and the performance of the RF power amplifier 10 of the present disclosure will be discussed in such terms. It will be recognized, however, that the principles discussed herein are applicable to other RF bands, and those having ordinary skill in the art will be able to adapt, based on the present disclosure, the RF power amplifier 10 to operate in such alternative frequency bands. In this context, a fundamental frequency refers to the 2.4 to 2.5 GHz carrier signal frequency, while harmonics thereof refer to the integer multiples of the fundamental frequency that are generated by active devices (transistors) in a conventional power amplifier operating in a non-linear fashion. As will be explained in further detail below, the present disclosure is directed to minimizing such harmonic emissions.

The basic components of an RF power amplifier 10, both conventional and in accordance with various embodiments of the present disclosure, are further generally defined by an input matching circuit 16, an output matching circuit 18, an active device or transistor Q1, a base control circuit 20, and a collector bias circuit 22. The transistor Q1 has three terminals—a base 24, a collector 26, and an emitter 28. Although in the exemplary embodiments the active device is shown as an NPN bipolar type transistor Q1, it will be recognized that a field effect transistor may be substituted, in which case there will be a gate, source, and drain, respectively. Furthermore, any suitable semiconductor architecture/transistor type may be utilized, including metal semiconductor field effect, metal oxide semiconductor field effect, high electron mobility, heterojunction bipolar, and so forth. Because the transistor Q1 serves as the primary signal amplification component, it may also be referred to as the amplifier active device. The input matching circuit 16 generally includes capacitors C1 and C2, as well as inductors L1 and L2, and is connected to the input port 12 and to the base 24 of the transistor Q1. The output matching circuit 18 generally includes capacitor C3 and inductor L3, and connected to the output port 14 and to the collector 26 of the transistor Q1. The emitter 28 is typically tied to ground, but the inductance value of that connection is defined as L4. The base control circuit 20 is generally defined by the voltage supply V1 that is applied through resistor R1, with the capacitor C4 being used for RF bypass purposes. The collector bias circuit 22 is generally defined by the bias voltage supply V2, and again, the capacitor C5 is used for RF bypass purposes.

Still referring to the schematic diagram of FIG. 1, the first embodiment of the RF power amplifier 10a includes a harmonic feedback circuit 30. According to this embodiment, a first terminal 32 or input of the harmonic feedback circuit 30 is connected to the collector 26 of the transistor Q1, while a second terminal 34 or output of the harmonic feedback circuit 30 is connected to the base 24 of the transistor Q1. The voltage components of the harmonics of the fundamental carrier frequency appear at the collector 26 of the transistor Q1 at high power levels, and are fed back to the base 24 of the transistor Q1 with opposite phase by the harmonic feedback circuit 30. This is understood to represent a negative feedback circuit at the harmonic frequencies, at a level that is correlated with a gain level of the transistor Q1. Furthermore, the negative feedback is configured to be minimal at the carrier fundamental frequency such that gain is not degraded. Additional details pertaining to the harmonic feedback circuit 30 will be considered more fully below.

Figure 2:
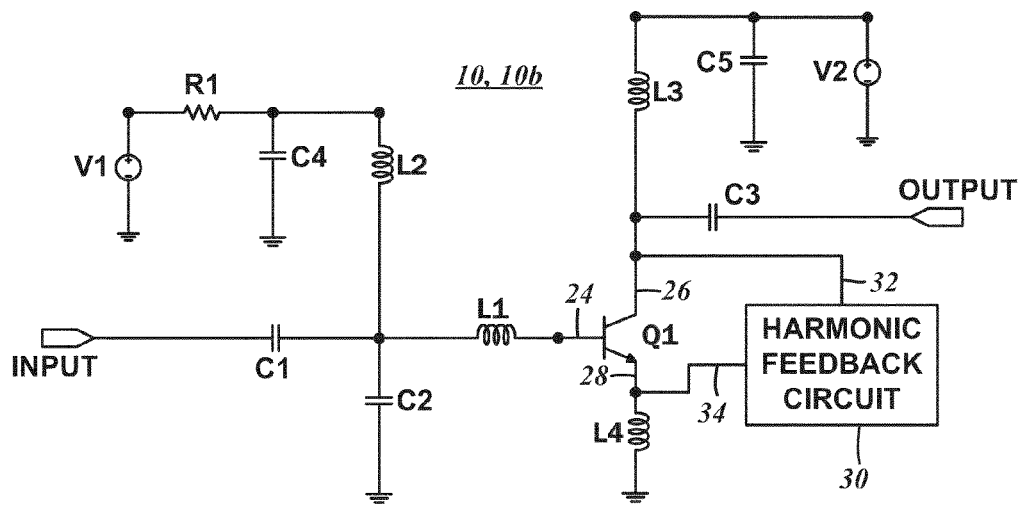
FIG. 2 is a schematic diagram of a second embodiment of the power amplifier circuit with the harmonic feedback circuit connected in an alternative configuration.

Various alternative configurations for connecting the harmonic feedback circuit 30 are also contemplated in accordance with the present disclosure. With reference to the schematic diagram of FIG. 2, in a second embodiment of the RF power amplifier 10b, the harmonic feedback circuit 30 is connected differently across the transistor Q1. The input or first terminal 32 of the harmonic feedback circuit 30 is connected to the collector 26 of the transistor Q1, while the output or second terminal 34 is connected to the emitter 28 of the transistor Q1. The voltage components of the harmonics of the fundamental carrier frequency appear at the collector 26 of the transistor Q1 at high power levels, and are fed back to the emitter 28 of the transistor Q1 with opposite phase by the harmonic feedback circuit 30. Again, a negative feedback at a level correlated with a gain level of the transistor Q1 is defined. Furthermore, the negative feedback for the carrier fundamental frequency is minimized.

Figure 3:
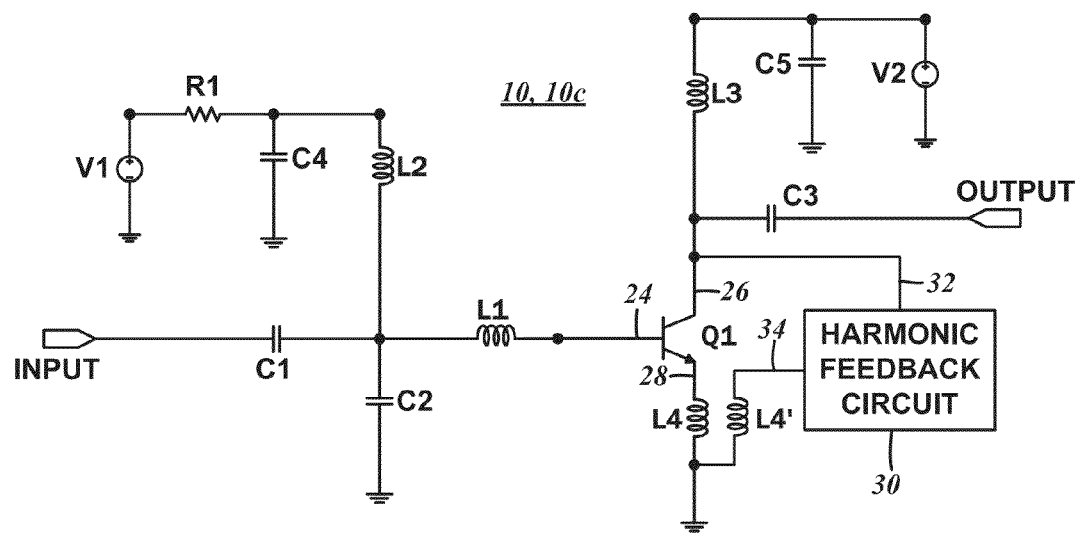
FIG. 3 is a schematic diagram of a third embodiment of the power amplifier circuit including the harmonic feedback circuit and coupled inductors.

The schematic diagram of FIG. 3 shows a third embodiment of the RF power amplifier 10c, which is understood to be a variation of the second embodiment 10b. In this regard, the first terminal 32 of the harmonic feedback circuit 30 is similarly connected to the collector 26 of the transistor Q1, and the second terminal 34 of the harmonic feedback circuit 30 is connected to the emitter 28 of the transistor Q1, though it is via coupled inductor L4 and L4' having a coupling coefficient K. More particularly, one terminal of the coupled inductor L4' is connected to the second terminal 34 of the harmonic feedback circuit 30, while the inductor L4 is connected to the emitter 28. According to this embodiment, there is understood to be more flexibility for component choice with respect to the harmonic feedback circuit 30, and achieve different levels of rejection at particular harmonic frequencies. This implementation is particularly suitable when the inductors L4 and L4' are based on bond wires.

Figure 4:
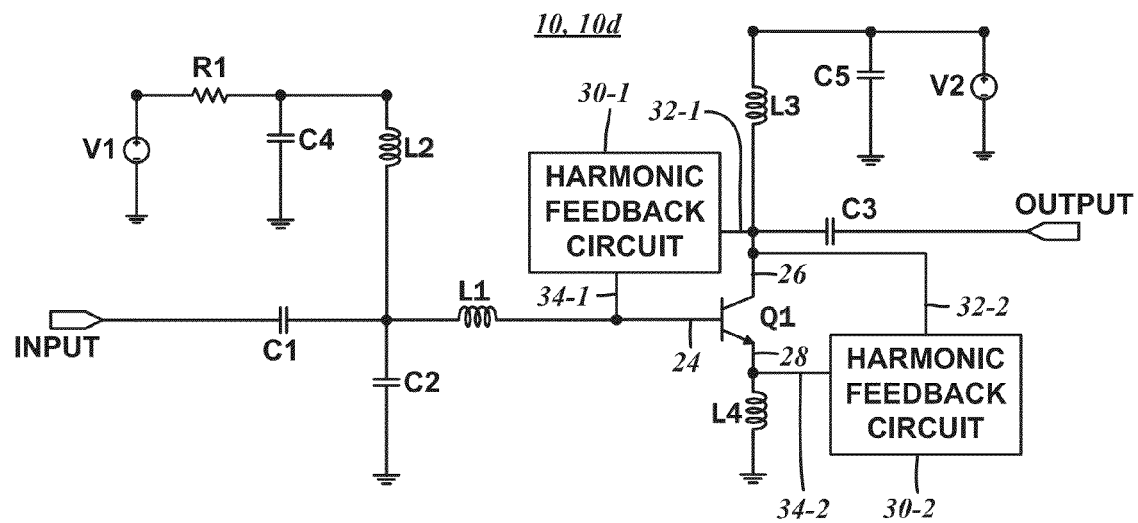
FIG. 4 is a schematic diagram of a fourth embodiment of the power amplifier circuit with a first harmonic feedback circuit and a second harmonic feedback circuit.

With reference to the schematic diagram of FIG. 4, a fourth embodiment of the RF power amplifier 10d includes the addition of a second harmonic feedback circuit 30-2. Thus, there is a first harmonic feedback circuit 30-1 with the first terminal 32-1 thereof connected to the collector 26 of the transistor Q1, as well as the second harmonic feedback circuit 30-2 with the first terminal 32-2 thereof also connected to the collector 26 of the transistor Q1. Furthermore, the second terminal 34-1 of the first harmonic feedback circuit 30-1 is connected to the base 24 of the transistor Q1, and the second terminal 34-2 of the second harmonic feedback circuit 30-2 is connected to the emitter 28 of the transistor Q1. Along the same lines as the third embodiment 10c discussed above, this configuration is understood to provide more flexibility in component choice in the harmonic feedback circuits 30-1, 30-2, and achieve higher levels of rejection at different harmonic frequencies.

Figure 5:
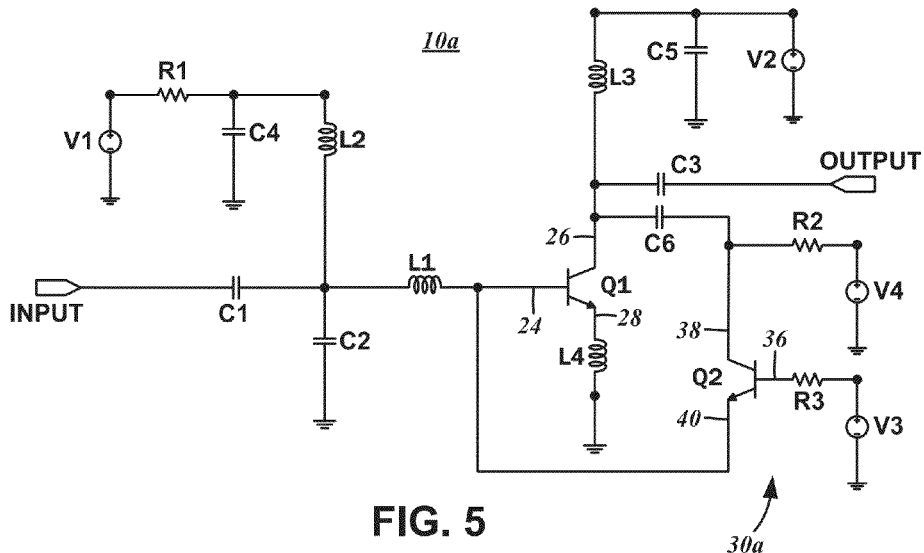
FIG. 5 is a schematic diagram of the first embodiment of the power amplifier circuit shown in FIG. 1, shown with a first variation of an implementation of the harmonic feedback circuit.

The present disclosure contemplates multiple variations of the harmonic feedback circuit 30, and any one of the following variations can be utilized in the aforementioned first, second, third, and fourth embodiments of the RF power amplifier 10a-10d described above. The schematic diagram of FIG. 5 illustrates one such variation 30a. In further detail, there is a second transistor Q2, also referred to as a first feedback active device with a base 36, a collector 38, and an emitter 40. Again, like the transistor Q1 discussed above, the second transistor Q2, which is depicted and described as a bipolar junction, NPN-type transistor, may be substituted with any other suitable transistor and/or semiconductor architecture, including metal semiconductor field effect, metal oxide semiconductor field effect, high electron mobility, heterojunction bipolar, etc. The second transistor Q2 may be used either in active mode or in passive mode while utilizing the non-linear characteristics of the appropriate diodes.

The collector 38 of the transistor Q2 is connected to the collector 26 of the transistor Q1 through capacitor C6, and the emitter 40 of the transistor Q2 is connected to the base 24 of the transistor Q1. In accordance with the present disclosure, each of the variations of the harmonic feedback circuit 30 utilizes the capacitor C6, which is envisioned to provide an appropriate phase shift of the harmonic frequency components. Furthermore, the transistor Q2 is chosen with the appropriate geometry (size), and configured with suitable supply and control voltages to provide an additional phase shift and signal shaping at the harmonic frequencies. According to one exemplary embodiment, the same configuration of the transistor Q1 can be selected, except with an emitter area than is approximately eight times smaller. The collector 38 of the transistor Q2 is biased by a voltage supply V4 through resistor R2, while the base 36 of the transistor Q2 is controlled by a voltage supply V3 through resistor R3. Such supply and control voltages are understood to define the non-linear base-collector and base-emitter capacitances and resistances. The voltage supply V3 may be either higher or lower than the voltage supply V4, though the voltage supply V3 is typically higher than the voltage supply V1 that controls the transistor Q1.

Figure 6:
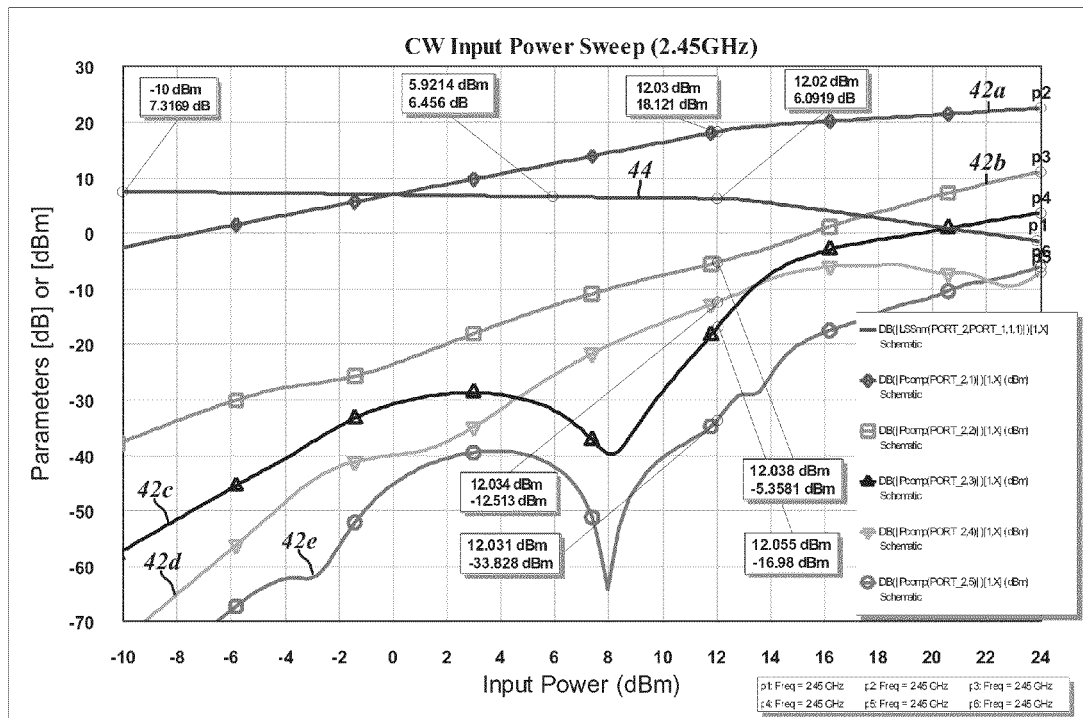
FIG. 6 is a graph showing power levels of the fundamental frequency and harmonic frequencies thereof for given input power levels for the first embodiment of the power amplifier circuit including the first variation of the harmonic feedback circuit as depicted in FIG. 5.

The graph of FIG. 6 shows the simulated power levels of the fundamental and harmonic frequency components generated at the output port 14 of the RF power amplifier 10 for a given input power. A first plot 42a shows the power levels of the fundamental frequency of the carrier signal, a second plot 42b shows the power levels of the second harmonic frequency, a third plot 42c shows the power levels of the third harmonic frequency, a fourth plot 42d shows the power levels of the fourth harmonic frequency, and a fifth plot 42e shows the power levels of the fifth harmonic frequency. Furthermore, a plot 44 shows the gain of the transistor Q1 between input and output ports. In comparison to a conventional RF power amplifier circuit that does not incorporate the harmonic feedback circuit 30 in accordance with the present disclosure, with input power levels between 6 to 10 dBm, power levels of the second harmonic and the fourth harmonic are lower by more than 10 dB, and more than 15 to 20 dB for third and fifth harmonics. It is expressly contemplated that additional tuning of the component values in the harmonic feedback circuit 30, as well as the values of the bias and control voltage supplies can yield higher levels of harmonic frequency rejection.

The simulated performance of the first embodiment of the RF power amplifier 10a with the first variation of the harmonic feedback circuit 30a operating with a 2.45 GHz carrier frequency is further compared and illustrated in the graphs of FIGS. 7A, 7B, 8A, 8B, 9A, 9B, 10A, and 10B.

Figure 7A:
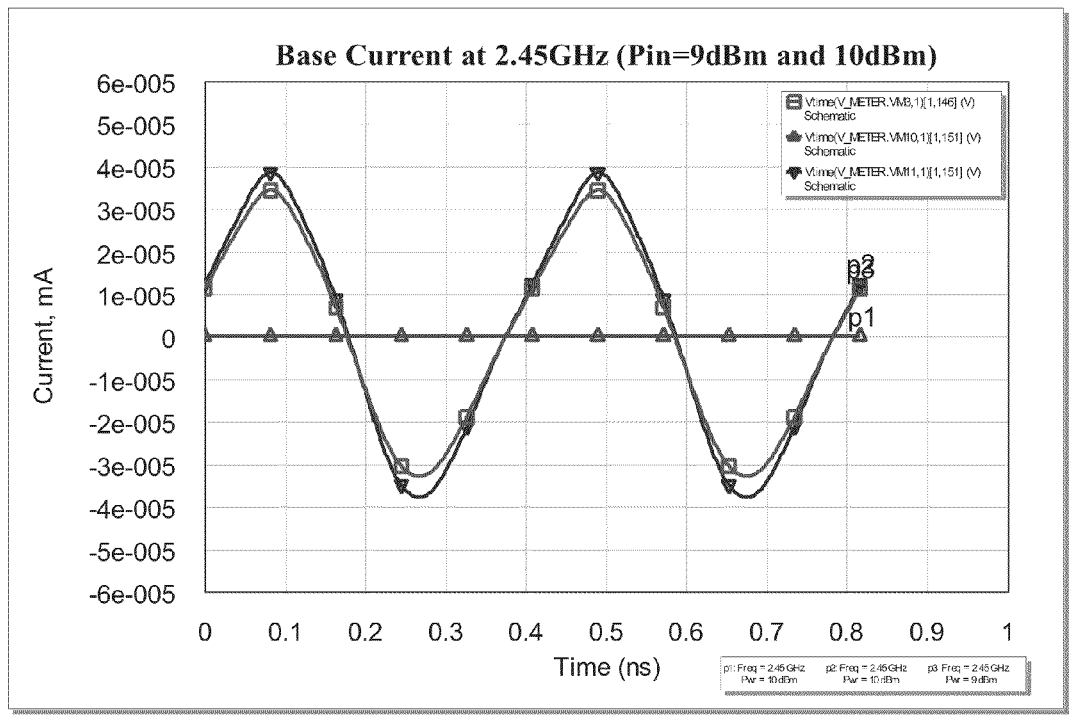
FIG. 7A is a graph showing a transistor base current for a conventional power amplifier circuit without the harmonic feedback circuit.
Figure 7B:
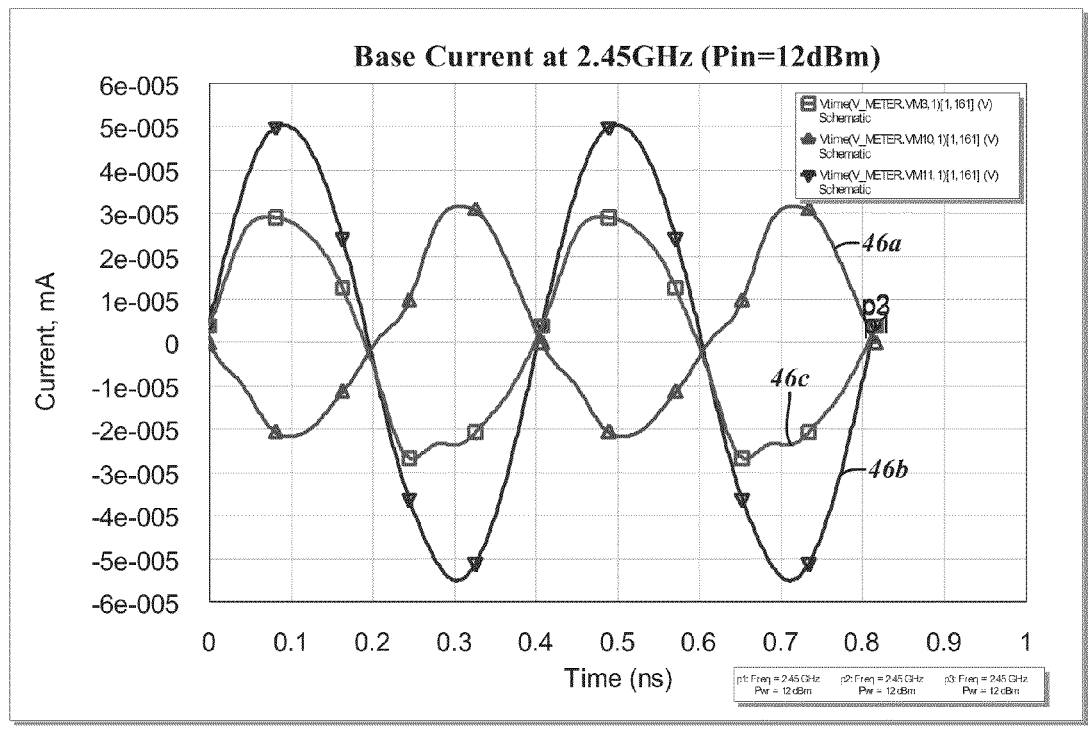
FIG. 7B is a graph showing a transistor base current for first embodiment of the power amplifier circuit including the first variation of the harmonic feedback circuit as depicted in FIG. 5.

The graphs of FIGS. 7A and 7B more particularly show the alternating current at the base 24 of the transistor Q1. The graph of FIG. 7A is that for a conventional RF power amplifier circuit without the harmonic feedback circuit 30. The graph of FIG. 7B shows a first plot 46a corresponding to the current from the harmonic feedback circuit 30 that is being passed to the base 24 of the transistor Q1, a second plot 46b corresponding to the current from the input matching circuit 16, and a third plot 46c corresponding to the total current that is being applied to the base 24 of the transistor Q1. As shown, there is a distortion in the current to the base 24 of the transistor Q1, which is understood to result in a lower power level of the harmonic frequency components at the output port 14 of the RF power amplifier 10.

Figure 8A:
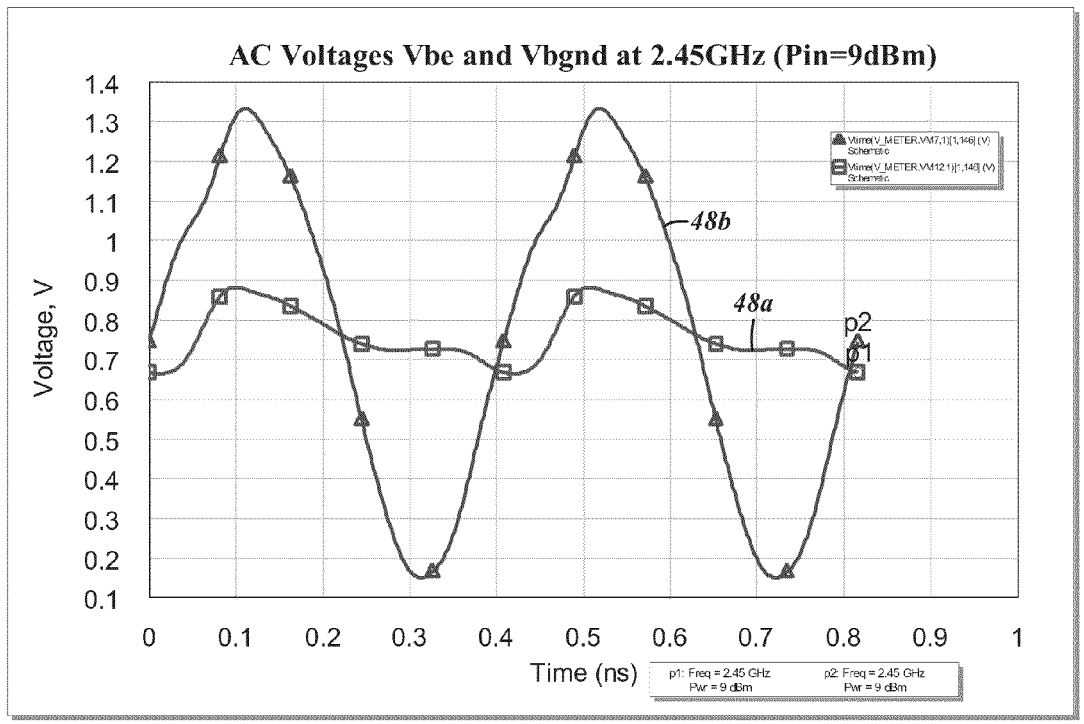
FIG. 8A is a graph showing a transistor base-emitter voltage and base-ground voltage for the conventional power amplifier circuit without the harmonic feedback circuit.
Figure 8B:
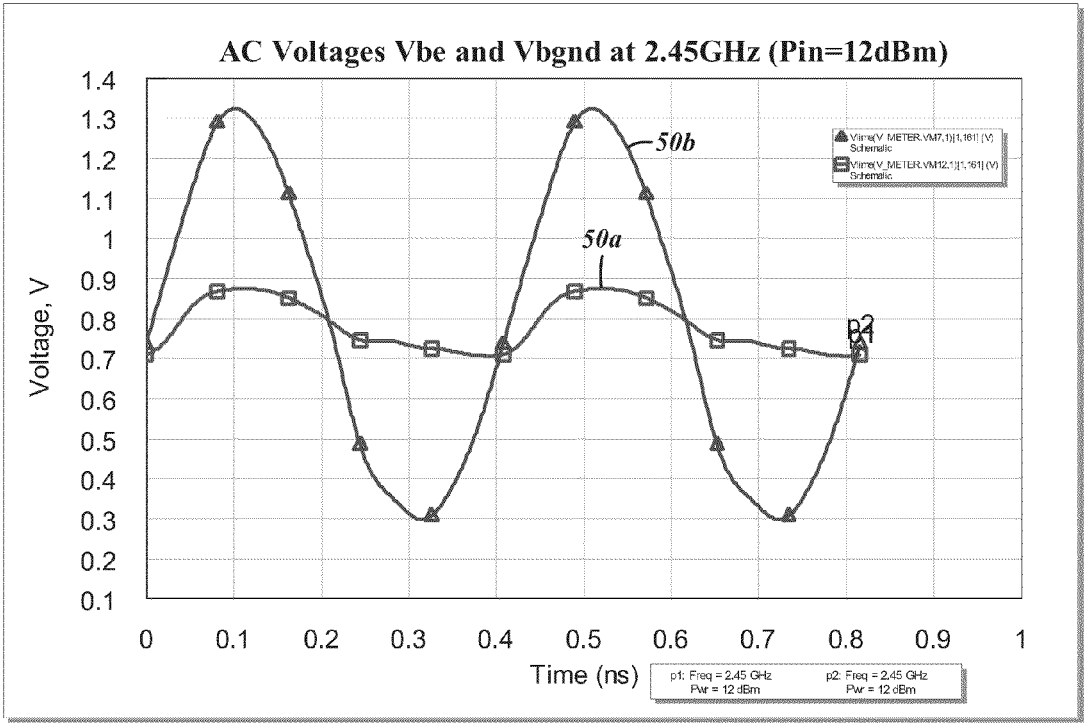
FIG. 8B is a graph showing a transistor base-emitter voltage and base-ground voltage for the first embodiment of the power amplifier circuit including the first variation of the harmonic feedback circuit as depicted in FIG. 5.

The graphs of FIGS. 8A and 8B more particularly show the voltage levels at the base 24 of the transistor Q1. The graph of FIG. 8A is that for a conventional RF power amplifier circuit without the harmonic feedback circuit 30, and includes a first plot 48a of the base-emitter voltage of the transistor Q1, and a second plot 48b of the base-ground voltage of the transistor Q1. Furthermore, the graph of FIG. 8B is that for the first embodiment of the RF power amplifier 10a with the first variation of the harmonic feedback circuit 30a, and similarly includes a first plot 50a of the base-emitter voltage of the transistor Q1 and a second plot 50b of the base-ground voltage of the transistor Q1.

Figure 9A:
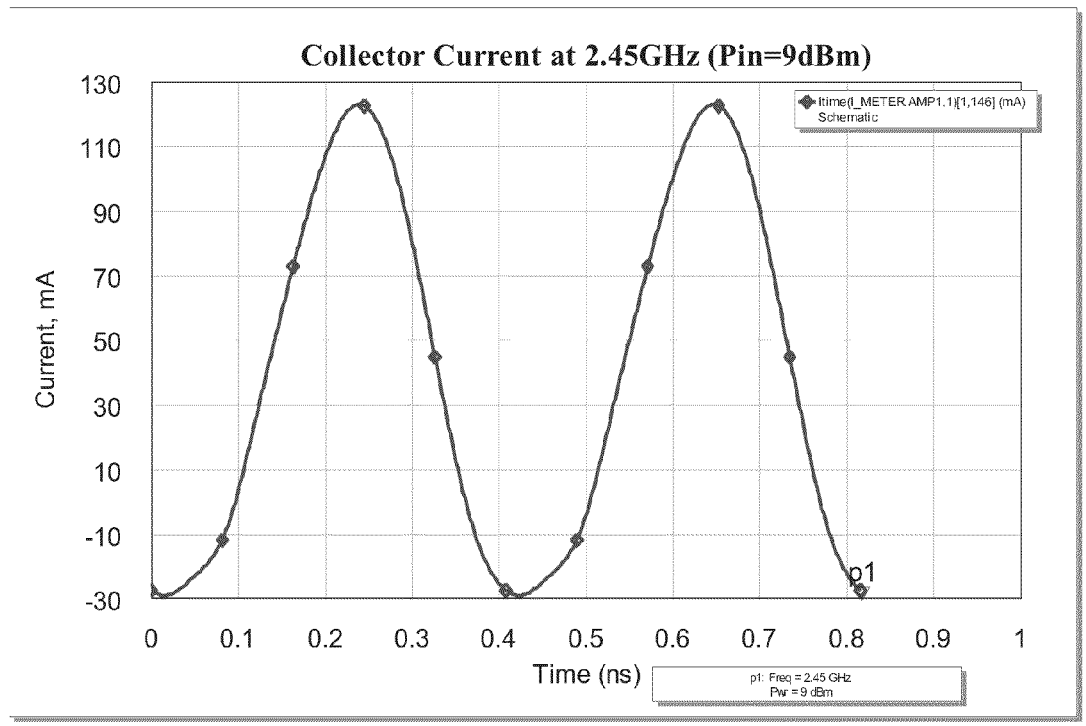
FIG. 9A is a graph showing a transistor collector current for the conventional power amplifier circuit without the harmonic feedback circuit.
Figure 9B:
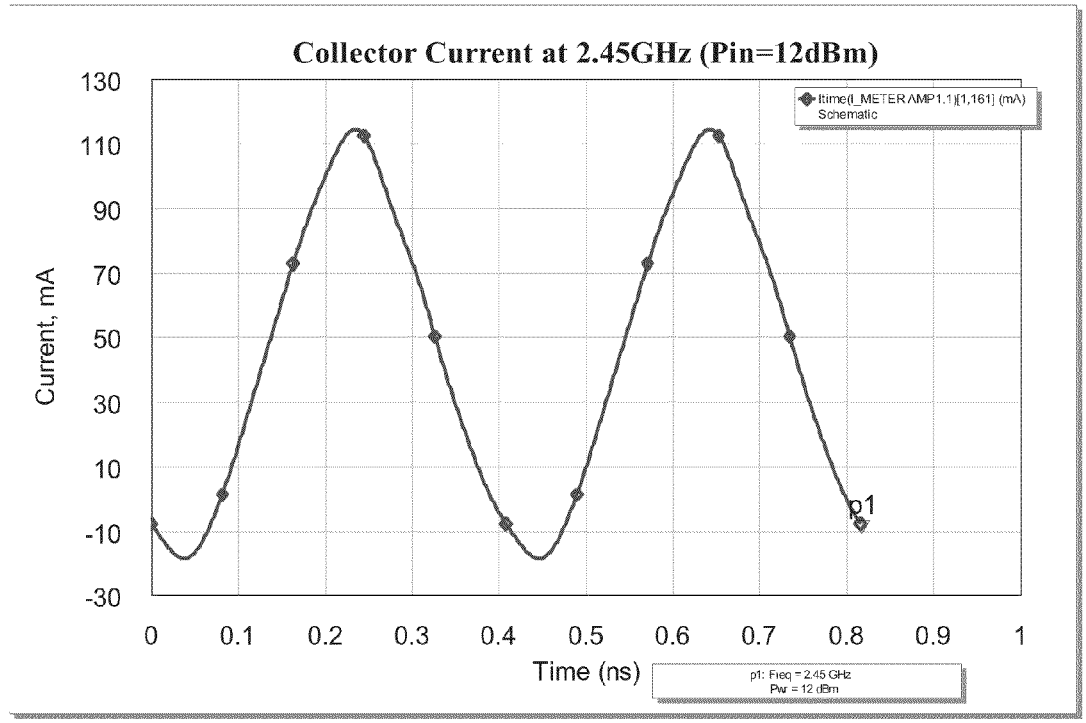
FIG. 9B is a graph showing a transistor collector current for the first embodiment of the power amplifier circuit including the first variation of the harmonic feedback circuit as depicted in FIG. 5.
Figure 10A:
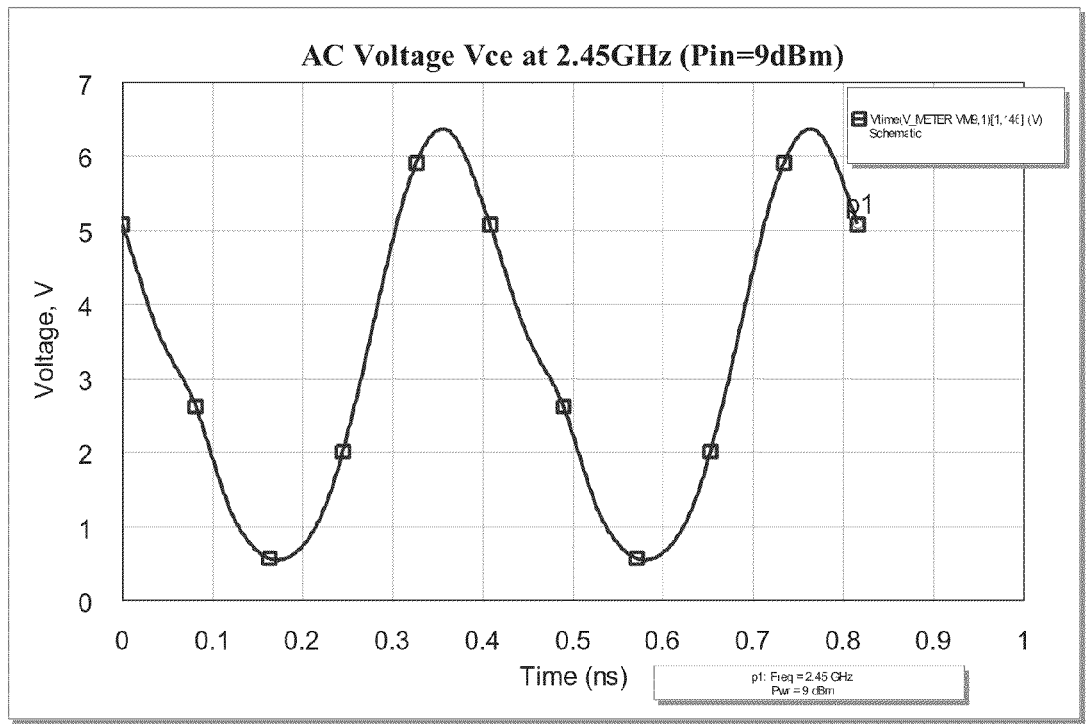
FIG. 10A is a graph showing a transistor collector-emitter voltage for the conventional power amplifier circuit without the harmonic feedback circuit.
Figure 10B:
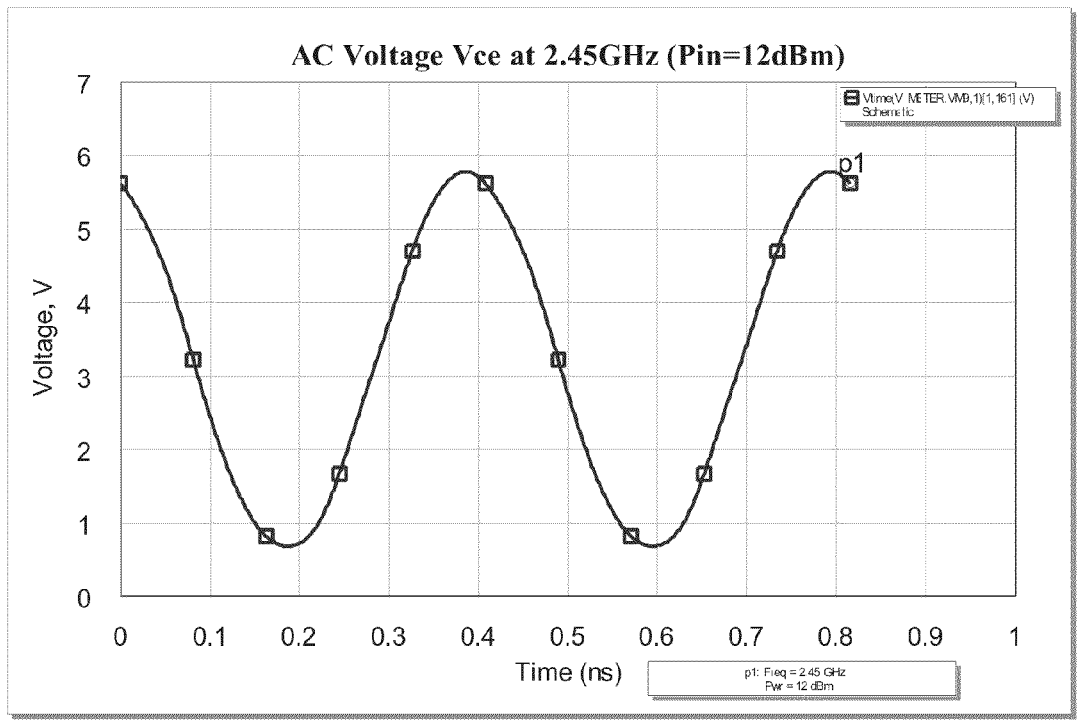
FIG. 10B is a graph showing a transistor collector-emitter voltage for the first embodiment of the power amplifier circuit including the first variation of the harmonic feedback circuit as depicted in FIG. 5.

The performance of the RF power amplifier 10 in relation to the fundamental carrier frequency signal remains the same despite the inclusion of the harmonic feedback circuit 30. To illustrate, the graphs of FIGS. 9A and 9B plot the collector current at the transistor Q1, with FIG. 9A showing the performance of a conventional RF power amplifier without the harmonic feedback circuit 30, and FIG. 9B showing the performance of the first embodiment of the RF power amplifier 10a with the first variation of the harmonic feedback circuit 30a. Further, the graphs of FIGS. 10A and 10B plot the collector-emitter voltage at the transistor Q1, with FIG. 10A showing the performance of a conventional RF power amplifier without the harmonic feedback circuit 30, and FIG. 10B showing the performance of the first embodiment of the RF power amplifier 10a with the first variation of the harmonic feedback circuit 30a.

Figure 11:
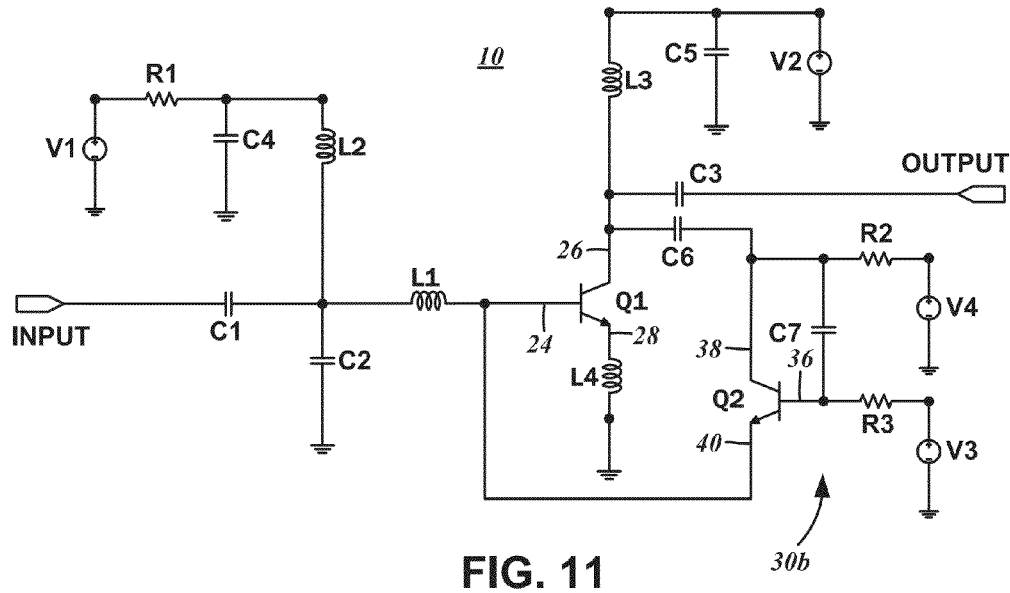
FIG. 11 is a schematic diagram of the first embodiment of the power amplifier circuit shown in FIG. 1, shown with a second variation of an implementation of the harmonic feedback circuit including a harmonics gain-shaping capacitor.

Referring now to the schematic diagram of FIG. 11, the RF power amplifier 10 with a second variation of the harmonic feedback circuit 30b will be considered. This variation likewise includes the transistor Q2 with its collector 38 being connected to the collector 26 of the transistor Q1 through the capacitor C6, and its emitter 40 being connected to the base 24 of the transistor Q1. As discussed above, the capacitor C6 is understood to provide an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. Furthermore, the transistor Q2 is chosen with the appropriate geometry (size), and configured with suitable supply and control voltages to provide additional phase shift and signal shaping at the harmonic frequencies. Such supply and control voltages are understood to define the non-linear base-collector and base-emitter capacitances and resistances. An additional capacitor C7 is connected between the base 36 of the transistor Q2 and the collector 38 of the transistor Q2, which is understood to change the gain shaping at various harmonic frequencies. The voltage supply V3 may be either higher or lower than the voltage supply V4, though the voltage supply V3 is typically higher than the voltage supply V1 that controls the transistor Q1.

Figure 12:
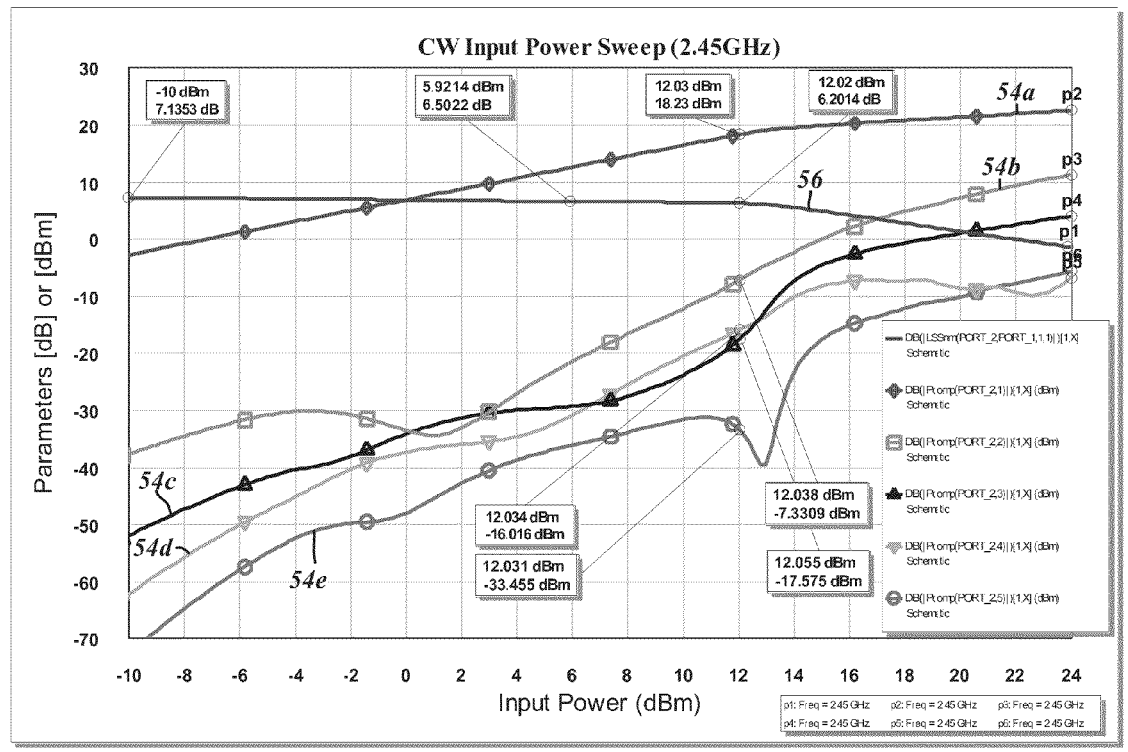
FIG. 12 a graph showing power levels of the fundamental frequency and harmonic frequencies thereof for given input power levels for the first embodiment of the power amplifier circuit including the second variation of the harmonic feedback circuit as depicted in FIG. 11.

The graph of FIG. 12 shows the simulated power levels of the fundamental and harmonic frequency components generated at the output port 14 of the RF power amplifier 10 with the second variation of the harmonic feedback circuit 30b for a given input power. A first plot 54a shows the power levels of the fundamental frequency of the carrier signal, a second plot 54b shows the power levels of the second harmonic frequency, a third plot 54c shows the power levels of the third harmonic frequency, a fourth plot 54d shows the power levels of the fourth harmonic frequency, and a fifth plot 54e shows the power levels of the fifth harmonic frequency. Furthermore, a plot 56 shows the gain of the transistor Q1 between input and output ports. In comparison to the RF power amplifier 10 utilizing the first variation of the harmonic feedback circuit 30a as plotted in FIG. 6, the second order harmonics are substantially decreased over a wider range of input power levels, for example, from 0 to 12 dBm, with the use of the capacitor C7. However, it is understood that the rejection of the 3rd and 5th harmonics are somewhat less, but in any case, greater than a conventional power amplifier that does not utilize the presently disclosed harmonic feedback circuit 30. Again, additional tuning of the component values in the harmonic feedback circuit 30, as well as the values of the bias and control voltage supplies can yield higher levels of harmonic frequency rejection.

Figure 13:
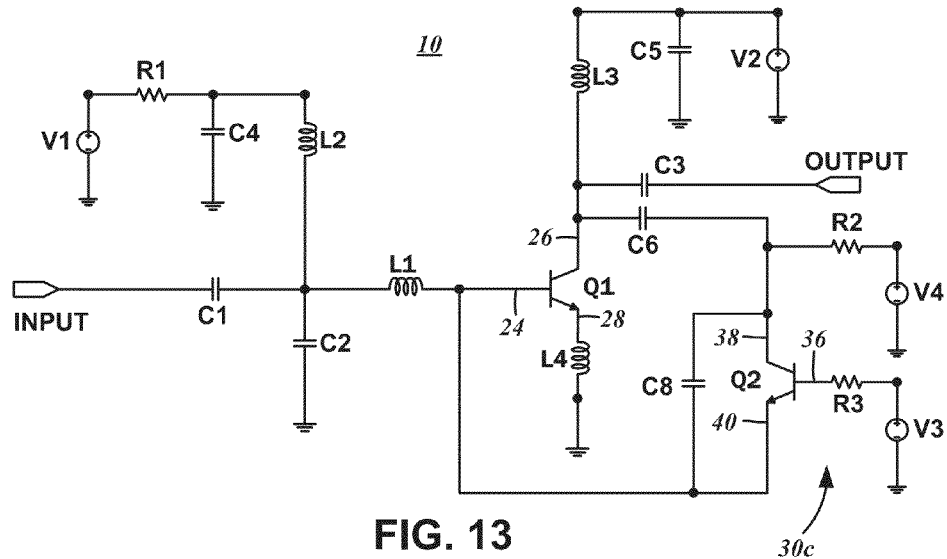
FIG. 13 is a schematic diagram of the first embodiment of the power amplifier circuit shown in FIG. 1, shown with a third variation of an implementation of the harmonic feedback circuit including a harmonics gain-shaping capacitor in an alternative configuration.

FIG. 13 is a schematic diagram of the RF power amplifier 10 with a third variation of the harmonic feedback circuit 30c. This variation also includes the transistor Q2 with its collector 38 connected to the collector 26 of the transistor Q1 through the capacitor C6, and its emitter 40 connected to the base 24 of the transistor Q1. As discussed above, the capacitor C6 provides an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. Furthermore, the transistor Q2 is chosen with the appropriate geometry (size), and configured with suitable supply and control voltages to provide additional phase shift and signal shaping at the harmonic frequencies. Such supply and control voltages define the non-linear base-collector and base-emitter capacitances and resistances. An additional capacitor C8 is connected between the collector 38 of the transistor Q2 and the emitter 40 of the transistor Q2 as well as the base 24 of the transistor Q1. The capacitor C8 is understood to change the gain shaping at various harmonic frequencies. The voltage supply V3 may be either higher or lower than the voltage supply V4, though the voltage supply V3 is typically higher than the voltage supply V1 that controls the transistor Q1.

Figure 14:
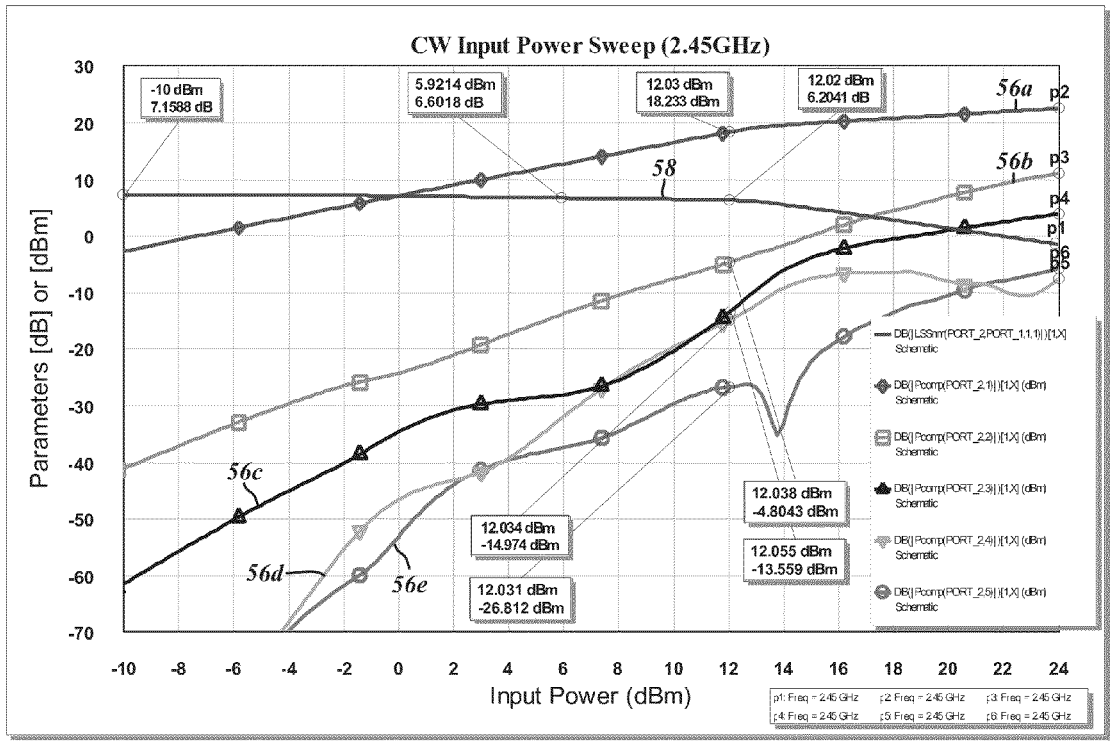
FIG. 14 is a graph showing power levels of the fundamental frequency and harmonic frequencies thereof for given input power levels for the first embodiment of the power amplifier circuit including the third variation of the harmonic feedback circuit as depicted in FIG. 13.

FIG. 14 is a graph showing the simulated power levels of the fundamental and harmonic frequency components generated at the output port 14 of the RF power amplifier 10 with the third variation of the harmonic feedback circuit 30c for a given input power. A first plot 56a shows the power levels of the fundamental frequency of the carrier signal, a second plot 56b shows the power levels of the second harmonic frequency, a third plot 56c shows the power levels of the third harmonic frequency, a fourth plot 56d shows the power levels of the fourth harmonic frequency, and a fifth plot 56e shows the power levels of the fifth harmonic frequency. A plot 58 shows the gain of the transistor Q1 between input and output ports. Comparing this third variation 30c against the performance of the first variation 30a and second variation 30b as plotted in FIG. 6 and FIG. 12, respectively, different rejection characteristics of harmonic frequencies over a wide range of input power levels is possible. Additional tuning of the component values in the harmonic feedback circuit 30, as well as the values of the bias and control voltage supplies can yield higher levels of harmonic frequency rejection.

Figure 15:
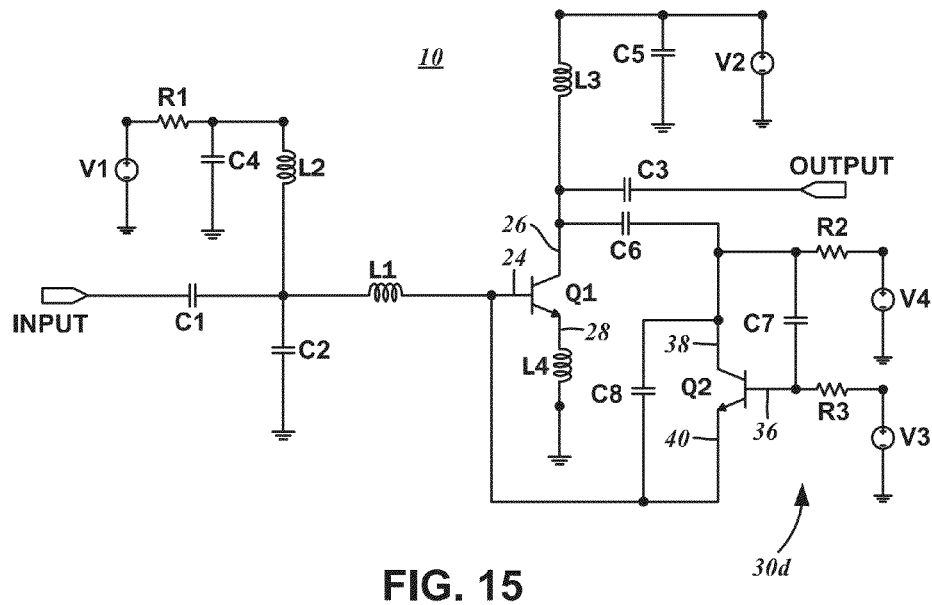
FIG. 15 is a schematic diagram of the first embodiment of the power amplifier circuit shown in FIG. 1, shown with a fourth variation of an implementation of the harmonic feedback circuit including harmonics gain-shaping capacitors.

With reference to the schematic diagram of FIG. 15, the RF power amplifier 10 with a fourth variation of the harmonic feedback circuit 30d likewise includes the transistor Q2 with its collector 38 being connected to the collector 26 of the transistor Q1 through the capacitor C6, and its emitter 40 being connected to the base 24 of the transistor Q1. Again, the capacitor C6 is understood to provide an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. The transistor Q2 is chosen with the appropriate geometry (size), and configured with suitable supply and control voltages to provide additional phase shift and signal shaping at the harmonic frequencies. The supply and control voltages are understood to define the non-linear base-collector and base-emitter capacitances and resistances. An additional capacitor C7 is connected between the base 36 of the transistor Q2 and the collector 38 of the transistor Q2 and still another capacitor C8 is connected between the collector 38 of the transistor Q2 and the emitter 40 of the transistor Q2 as well as the base 24 of the transistor Q1, both which are understood to change the gain shaping at various harmonic frequencies. The voltage supply V3 may be either higher or lower than the voltage supply V4, though the voltage supply V3 is typically higher than the voltage supply V1 that controls the transistor Q1.

Figure 16:
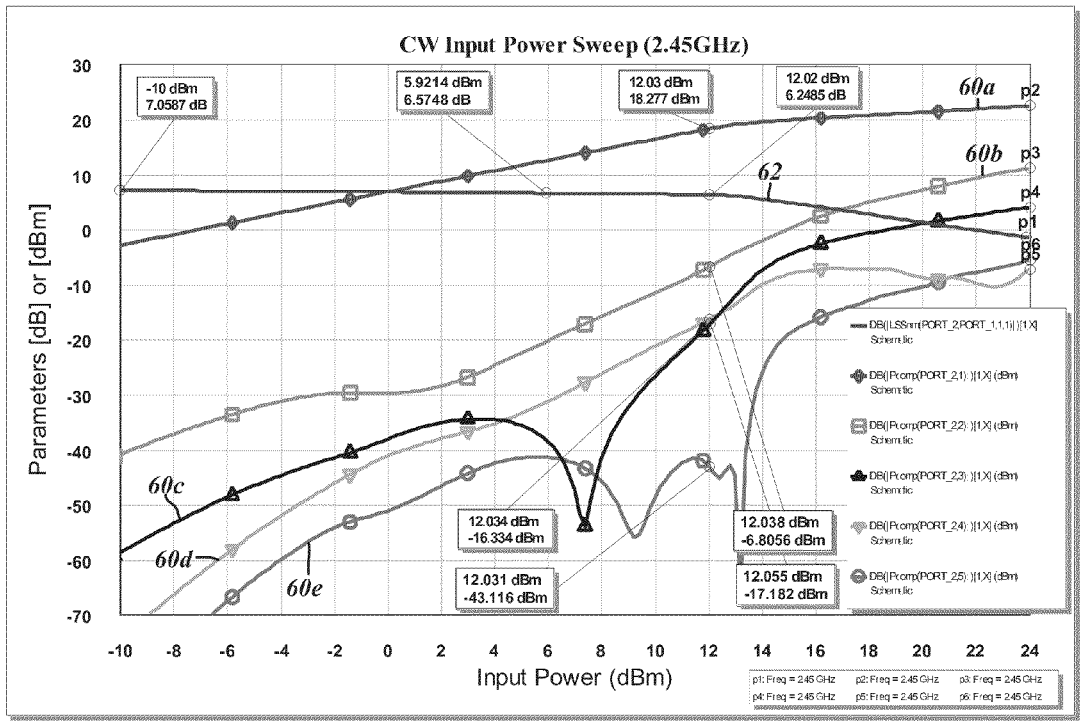
FIG. 16 is a graph showing power levels of the fundamental frequency and harmonic frequencies thereof for given input power levels for the first embodiment of the power amplifier circuit including the fourth variation of the harmonic feedback circuit as depicted in FIG. 15.

The graph of FIG. 16 shows the simulated power levels of the fundamental and harmonic frequency components generated at the output port 14 of the RF power amplifier 10 with the fourth variation of the harmonic feedback circuit 30d for a given input power. A first plot 60a shows the power levels of the fundamental frequency of the carrier signal, a second plot 60b shows the power levels of the second harmonic frequency, a third plot 60c shows the power levels of the third harmonic frequency, a fourth plot 60d shows the power levels of the fourth harmonic frequency, and a fifth plot 60e shows the power levels of the fifth harmonic frequency. A plot 62 shows the gain of the transistor Q1 between input and output ports. Compared to the other variations of the harmonic feedback circuit 30a-30c, the performance of which are shown in the graphs of FIGS. 6, 12, and 14, there is understood to be a substantial reduction of power levels at the third and fifth harmonic frequencies across a wide range of input powers. The component values in the harmonic feedback circuit 30, as well as the values of the bias and control voltage supplies can be tuned to yield higher levels of harmonic frequency rejection.

Referring back to the schematic diagram of FIG. 11, the RF power amplifier 10 utilizing the second variation of the harmonic feedback circuit 30b can be optimized to maximize the rejection of the second harmonic yet retaining the high rejection of the other harmonic frequencies over a wide range of input power levels with certain preferred, though optional component values. In particular, the capacitor C6 is set at 0.75 pF, the capacitor C7 is set at 0.18 pF, the resistor R2 is set at 300 Ohm, and the resistor R3 is set at 160 Ohm.

Figure 17A:
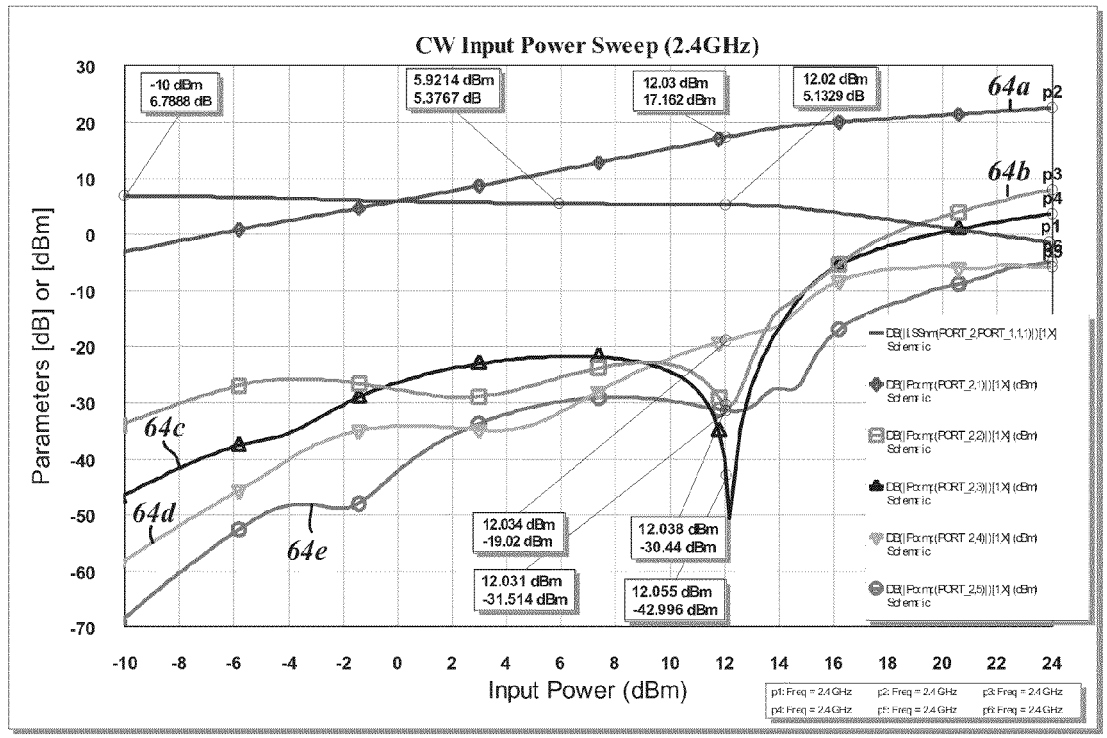
FIGS. 17A-17C are graphs showing power levels of the fundamental frequencies and harmonic frequencies thereof for given input power levels for the first embodiment of the power amplifier circuit with a second variation of an implementation of the harmonic feedback circuit including the harmonics gain-shaping capacitor as shown in FIG. 11, using preferred, though optional component values.
Figure 17B:
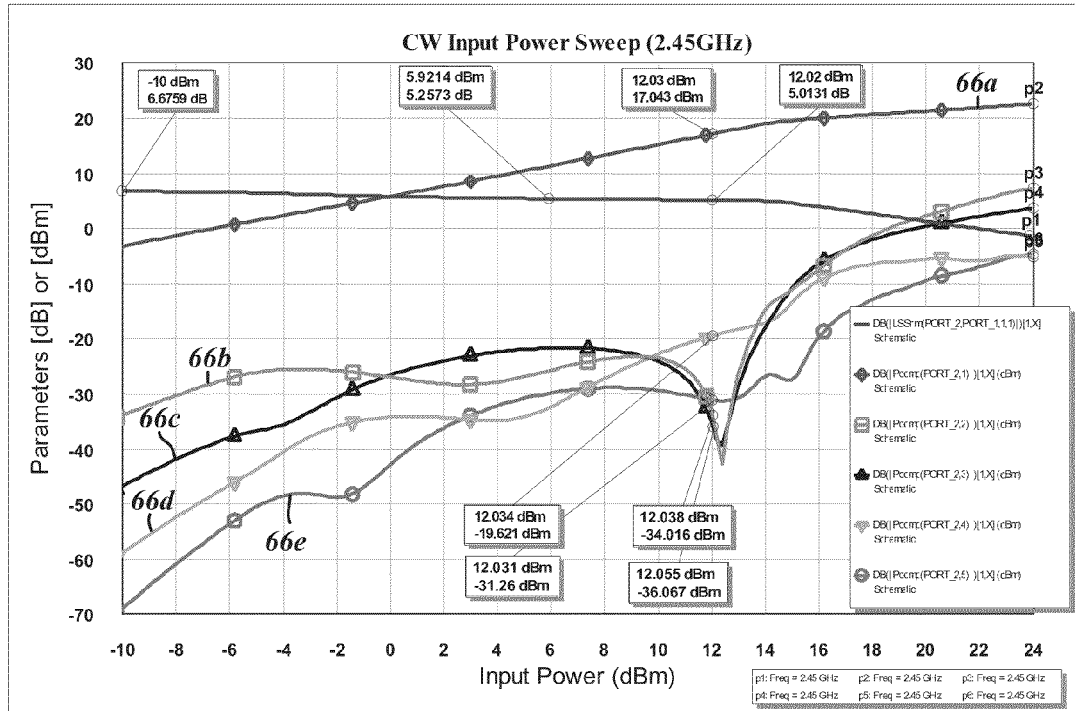
Figure 17C:
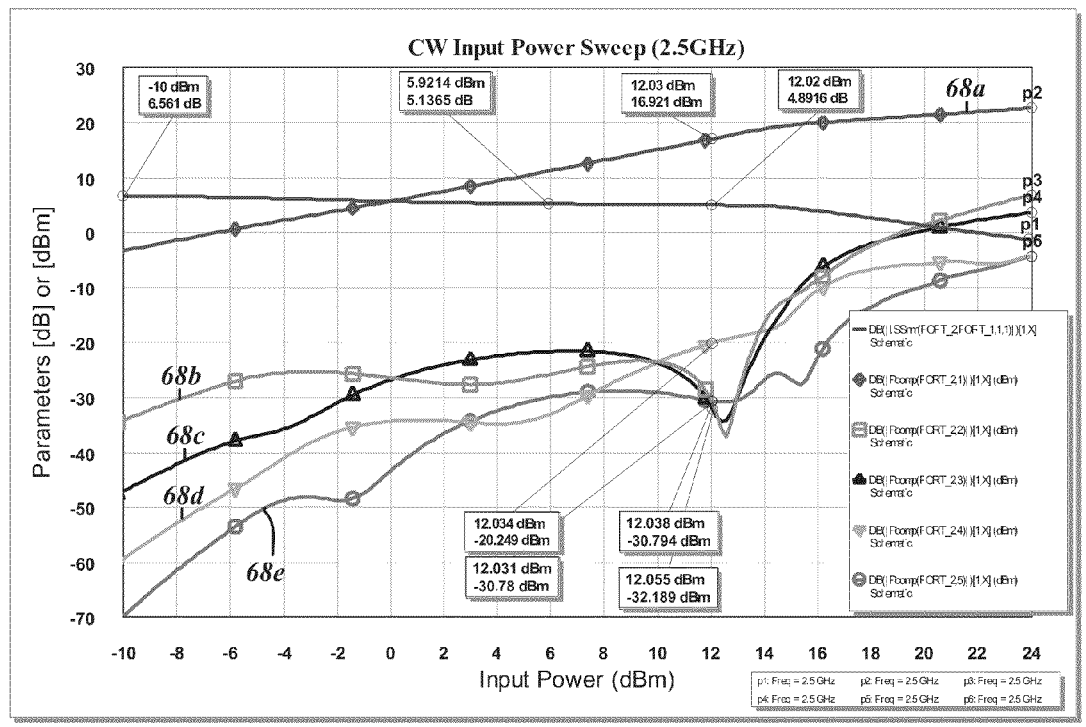

The graphs of FIGS. 17A-17C plot the performance of the RF power amplifier 10 that utilizes the second variation of the harmonic feedback circuit 30b with the foregoing component values. In further detail, FIG. 17A plots the performance at the low end of the 2.45 GHz ISM band, e.g., 2.4 GHz. It includes a first plot 64a that shows the power levels of the fundamental frequency of the carrier signal, a second plot 64b that shows the power levels of the second harmonic frequency, a third plot 64c that shows the power levels of the third harmonic frequency, a fourth plot 64d that shows the power levels of the fourth harmonic frequency, and a fifth plot 64e that shows the power levels of the fifth harmonic frequency. FIG. 17B plots the performance at the middle of the 2.45 GHz ISM band, and includes a first plot 66a that shows the power levels of the fundamental frequency of the carrier signal, a second plot 66b that shows the power levels of the second harmonic frequency, a third plot 66c that shows the power levels of the third harmonic frequency, a fourth plot 66d that shows the power levels of the fourth harmonic frequency, and a fifth plot 66e that shows the power levels of the fifth harmonic frequency. FIG. 17C plots the performance at the high end of the 2.45 GHz ISM band, e.g., 2.5 GHz. This graph includes a first plot 68a that shows the power levels of the fundamental frequency of the carrier signal, a second plot 68b that shows the power levels of the second harmonic frequency, a third plot 68c that shows the power levels of the third harmonic frequency, a fourth plot 68d that shows the power levels of the fourth harmonic frequency, and a fifth plot 68e that shows the power levels of the fifth harmonic frequency. As shown in the foregoing graphs, the performance of the RF power amplifier 10 remains consistent across the entire operating band, with similar harmonic rejection characteristics throughout and substantial rejection of the second harmonic frequency.

Figure 18:
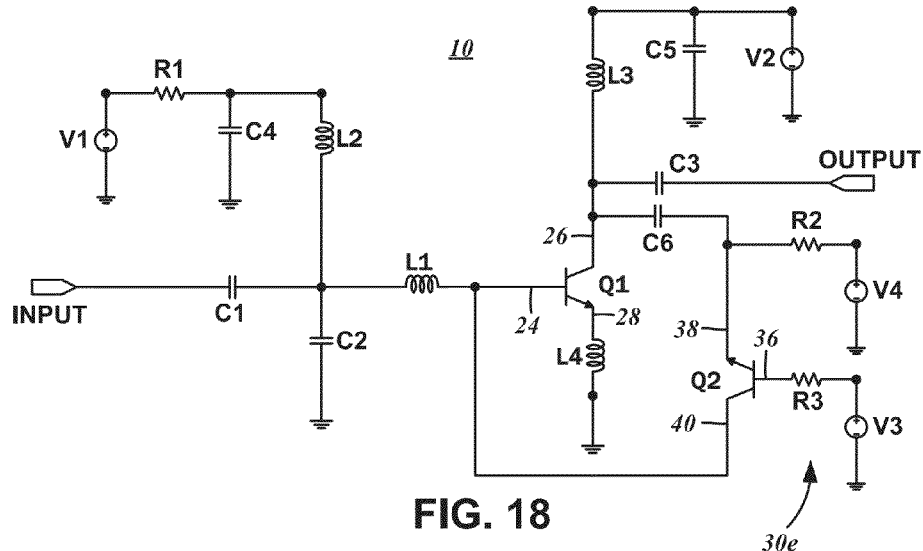
FIG. 18 is a schematic diagram of the first embodiment of the power amplifier circuit shown in FIG. 1, shown with a fifth variation of an implementation of the harmonic feedback circuit.

FIG. 18 depicts the RF power amplifier 10 with a fifth variation of the harmonic feedback circuit 30e. This variation likewise includes the transistor Q2, but departing from the previously described variations, its collector 40 is connected to the base 24 of the transistor Q1, and its emitter 38 is connected to the collector 26 of the transistor Q1 through the capacitor C6. As discussed above, the capacitor C6 is understood to provide an appropriate phase shift of the harmonic frequency components. The emitter 38 of the transistor Q2 is biased by the voltage supply V4 through resistor R2, while the base 36 of the transistor Q2 is controlled by a voltage supply V3 through resistor R3. Furthermore, the transistor Q2 is chosen with the appropriate geometry (size), and configured with suitable supply and control voltages to provide additional phase shift and signal shaping at the harmonic frequencies. Such supply and control voltages are understood to define the non-linear base-collector and base-emitter capacitances and resistances. The voltage supply V3 may be either higher or lower than the voltage supply V4, though the voltage supply V3 is typically higher than the voltage supply V1 that controls the transistor Q1.

Figure 19:
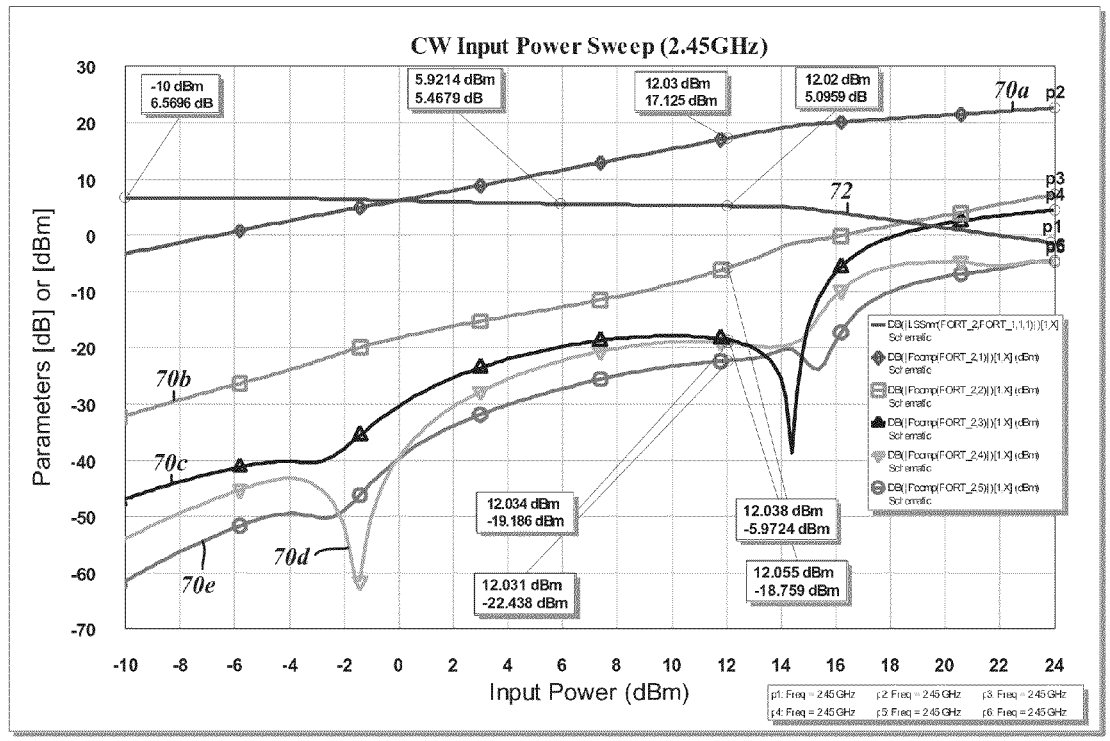
FIG. 19 is a graph showing power levels of the fundamental frequency and harmonic frequencies thereof for given input power levels for the first embodiment of the power amplifier circuit including the fifth variation of the harmonic feedback circuit as depicted in FIG. 18.

The graph of FIG. 19 shows the simulated power levels of the fundamental and harmonic frequency components generated at the output port 14 of the RF power amplifier 10 with the fifth variation of the harmonic feedback circuit 30e for a given input power. A first plot 70a shows the power levels of the fundamental frequency of the carrier signal, a second plot 70b shows the power levels of the second harmonic frequency, a third plot 70c shows the power levels of the third harmonic frequency, a fourth plot 70d shows the power levels of the fourth harmonic frequency, and a fifth plot 70e shows the power levels of the fifth harmonic frequency. A plot 72 shows the gain of the transistor Q1 between input and output. In this configuration, although the fifth harmonic frequency does not appear to be reduced significantly over a conventional RF power amplifier that does not utilize the harmonic feedback circuit 30, but the second, third, and fourth harmonic frequencies are reduced over a wide input power range. Again, the component values in the harmonic feedback circuit 30, as well as the values of the bias and control voltage supplies can be tuned to yield higher levels of harmonic frequency rejection.

Figure 20:
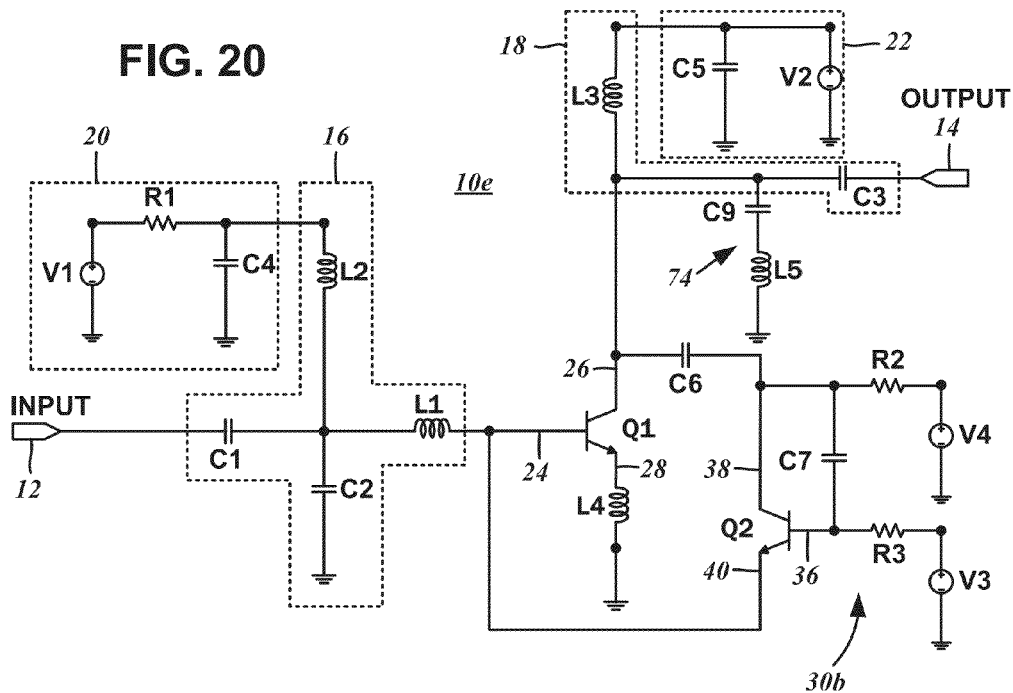
FIG. 20 is a schematic diagram of a fifth embodiment of the power amplifier circuit with a second-harmonic filter and the second variation of the harmonic feedback circuit.

A fifth embodiment of the RF power amplifier 10e shown in the schematic diagram of FIG. 20 contemplates the inclusion of a second-harmonic rejection filter 74 which become a part of the output matching network. Again, the RF power amplifier 10e is generally defined by the input port 12 that is connected to an output of a RF transceiver (not shown), and the output port 14 that is connected to an antenna (not shown). There is the input matching circuit 16, the output matching circuit 18, the active device or transistor Q1, the base control circuit 20, and the collector bias circuit 22. The input matching circuit 16 generally includes capacitors C1 and C2, as well as inductors L1 and L2, and is connected to the input port 12 and to the base 24 of the transistor Q1. The output matching circuit 18 generally includes capacitor C3 and inductor L3, and connected to the output port 14 and to the collector 26 of the transistor Q1. The emitter 28 is typically tied to ground, but the inductance value of that connection is defined as L4. The base control circuit 20 is generally defined by the voltage supply V1 that is applied through resistor R1, with the capacitor C4 being used for RF bypass purposes. The collector bias circuit 22 is generally defined by the bias voltage supply V2, and again, the capacitor C5 is used for RF bypass purposes. The aforementioned second-harmonic rejection filter 74 includes the capacitor C9 and the inductor L5, both of which are tuned for series resonance at the second harmonic frequency. This is understood to filter second harmonic signals. In this and other embodiments, the input matching circuit 16 and the output matching circuit 18 can also serve harmonics filtering purposes, but it will be appreciated that other types of input and output matching circuits can be substituted without departing from the scope of the present disclosure.

The fifth embodiment of the RF power amplifier 10e also utilizes the second variation of the harmonic feedback circuit 30b discussed above with reference to the schematic diagram of FIG. 11. In this regard, there is the transistor Q2 with its collector 38 being connected to the collector 26 of the transistor Q1 through the capacitor C6, and its emitter 40 being connected to the base 24 of the transistor Q1. As also discussed above, the capacitor C6 is understood to provide an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. The transistor Q2 is chosen with the appropriate geometry (size), and configured with suitable supply and control voltages to provide additional phase shift and signal shaping at the harmonic frequencies. Such supply and control voltages are understood to define the non-linear base-collector and base-emitter capacitances and resistances. An additional capacitor C7 is connected between the base 36 of the transistor Q2 and the collector 38 of the transistor Q2, which is understood to change the gain shaping at various harmonic frequencies. The voltage supply V3 may be either higher or lower than the voltage supply V4, though the voltage supply V3 is typically higher than the voltage supply V1 that controls the transistor Q1.

Figure 21:
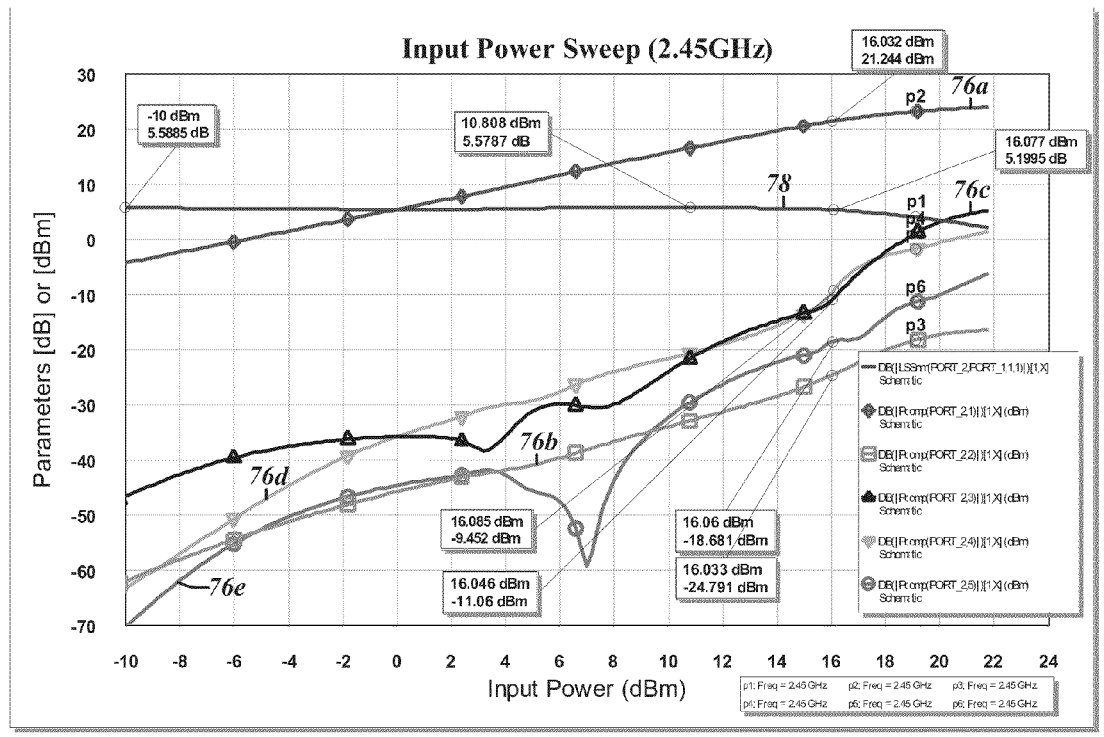
FIG. 21 is a graph showing power levels of the fundamental frequency and harmonic frequencies thereof for given input levels for the fifth embodiment of the power amplifier circuit with the second-harmonic filter and the second variation of the harmonic feedback circuit as depicted in FIG. 20.

The graph of FIG. 21 shows the simulated power levels of the fundamental and harmonic frequency components generated at the output port 14 of the RF power amplifier 10e with the second variation of the harmonic feedback circuit 30b for a given input power. A first plot 76a shows the power levels of the fundamental frequency of the carrier signal, a second plot 76b shows the power levels of the second harmonic frequency, a third plot 76c shows the power levels of the third harmonic frequency, a fourth plot 76d shows the power levels of the fourth harmonic frequency, and a fifth plot 76e shows the power levels of the fifth harmonic frequency. A plot 78 shows the gain of the transistor Q1 between input and output. In accordance with the harmonic rejection characteristics of utilizing the second variation of the harmonic feedback circuit 30b, the third, fourth, and fifth harmonic frequencies are substantially minimized. With the inclusion of the second-harmonic rejection filter 74, 30 dB of additional reduction in the second harmonic frequency power level are possible, even without the harmonic feedback circuit 30b. Because little to none of the emissions of the second harmonic frequency are being fed back to the transistor Q1, additional reduction by use of the harmonic feedback circuit 30b is minimal.

Figure 22:
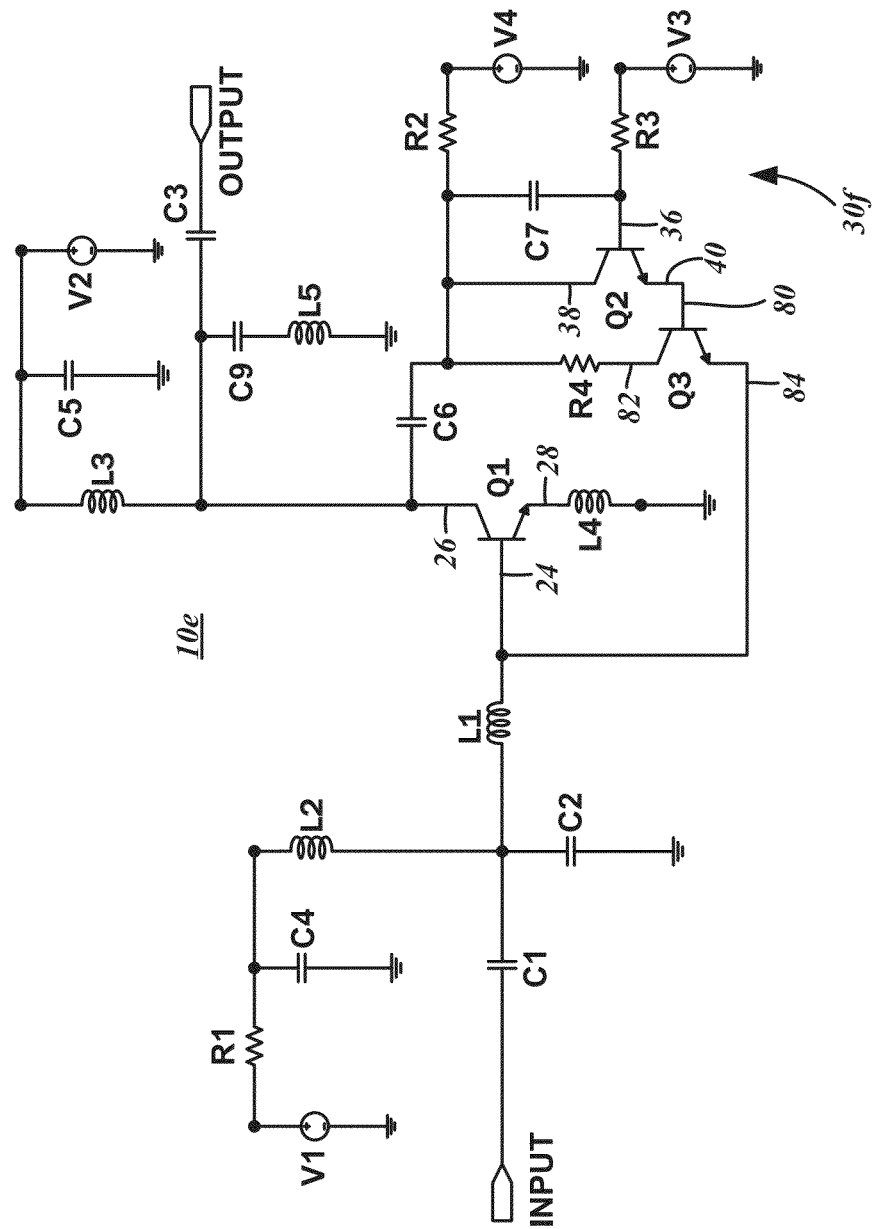
FIG. 22 is a schematic diagram of the fifth embodiment of the power amplifier circuit with the second-harmonic filter and a sixth variation of the harmonic feedback circuit with a Darlington configuration.

With reference to the schematic diagram of FIG. 22, the fifth embodiment of the RF power amplifier 10e including the second-harmonic rejection filter 74 may utilize an alternatively configured sixth variation of the harmonic feedback circuit 30f. In general, this variation is comprised of two transistors in a Darlington configuration. There is the transistor Q2, which has the base 36, the collector 38, and the emitter 40. Additionally, a transistor Q3 is included, which has a base 80, a collector 82, and an emitter 84. The collector 26 of the transistor Q1 is connected to the collector 82 of the transistor Q3 through the capacitor C6 and the resistor R4, as well as to the collector 38 of the transistor Q2 just through the capacitor C6. A preferred, though optional value of the resistor R4 may be 50 Ohm. As also discussed above, the capacitor C6 is understood to provide an appropriate phase shift of the harmonic frequency components. The emitter 40 of the transistor Q2 is connected to the base 80 of the transistor Q3, and the emitter 84 of the transistor Q3 is connected to the base 24 of the transistor Q1. The collector 82 of the transistor Q3 is connected to the collector 38 of the transistor Q2 through resistor R4. The collector 38 of the transistor Q2 is biased by the voltage supply V4 through resistor R2, while the base 36 of the transistor Q2 is controlled by a voltage supply V3 through resistor R3. A preferred, though optional value of both the resistors R3 and R4 may be 140 Ohm. The transistor Q2 and the transistor Q3 are chosen with the appropriate geometry (size), and configured with suitable supply and control voltages to provide additional phase shift and signal shaping at the harmonic frequencies. Such supply and control voltages are understood to define the non-linear base-collector and base-emitter capacitances and resistances. In one preferred, though optional embodiment, the transistor Q3 is the same as transistor Q1, though with its emitter area being eight times smaller. Furthermore, the transistor Q2 is contemplated to have an emitter area five times lower than the transistor Q3, though other sizes are also contemplated. An additional capacitor C7 is connected between the base 36 of the transistor Q2 and the collector 38 of the transistor Q2, which is understood to change the gain shaping at various harmonic frequencies. The voltage supply V3 may be either higher or lower than the voltage supply V4, though the voltage supply V3 is typically higher than the voltage supply V1 that controls the transistor Q1.

Figure 23A:
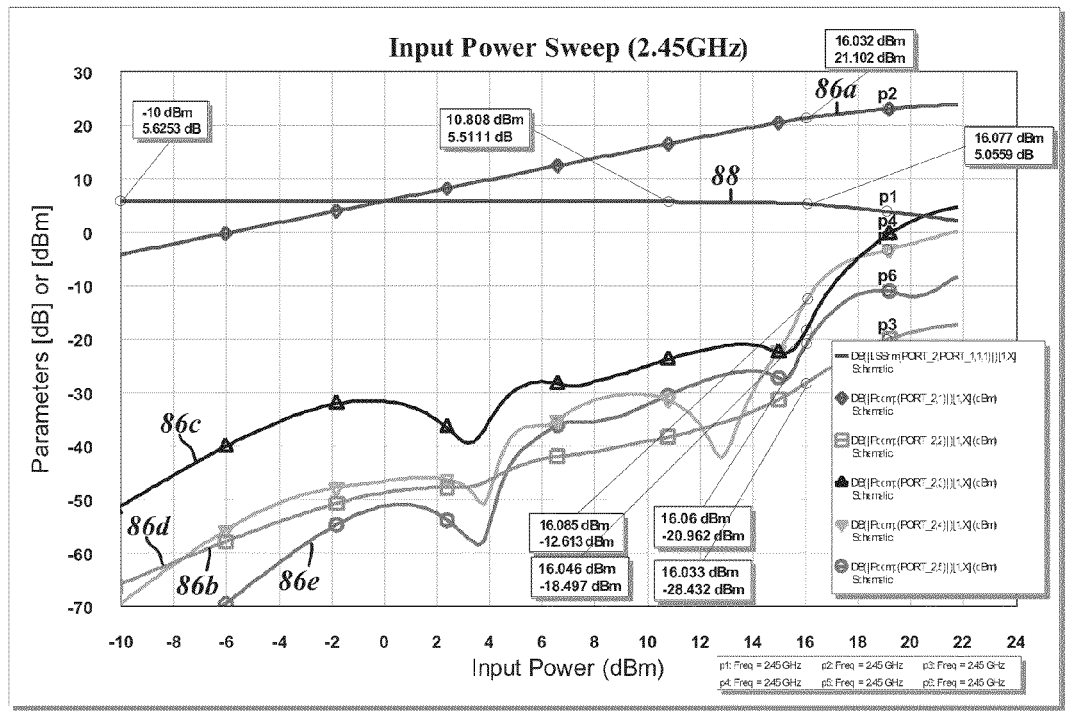
FIG. 23A is a graph showing power levels of the fundamental frequency and harmonic frequencies thereof for given input levels for the fifth embodiment of the power amplifier circuit with the second stage harmonic filter and the sixth variation of the harmonic feedback circuit as depicted in FIG. 22 under a first set of bias voltages.

FIG. 23A is a graph showing the simulated power levels of the fundamental and harmonic frequency components generated at the output port 14 of the fifth embodiment of the RF power amplifier 10e with the second variation of the harmonic feedback circuit 30b for a given input power. For this simulation, control voltage V3 and the bias supply voltage V4 have been both set to 2.0V. A first plot 86a shows the power levels of the fundamental frequency of the carrier signal, a second plot 86b shows the power levels of the second harmonic frequency, a third plot 86c shows the power levels of the third harmonic frequency, a fourth plot 86d shows the power levels of the fourth harmonic frequency, and a fifth plot 86e shows the power levels of the fifth harmonic frequency. A plot 88 shows the gain of the transistor Q1 between input and output. In comparison to the previously described fifth embodiment of the RF power amplifier 10e utilizing the second variation of the harmonic feedback circuit 30b, there is a substantial reduction of the fourth harmonic frequency over a wide input power range. Again, additional tuning of the component values in the harmonic feedback circuit 30, as well as the values of the bias and control voltage supplies can yield higher levels of harmonic frequency rejection.

Figure 23B:
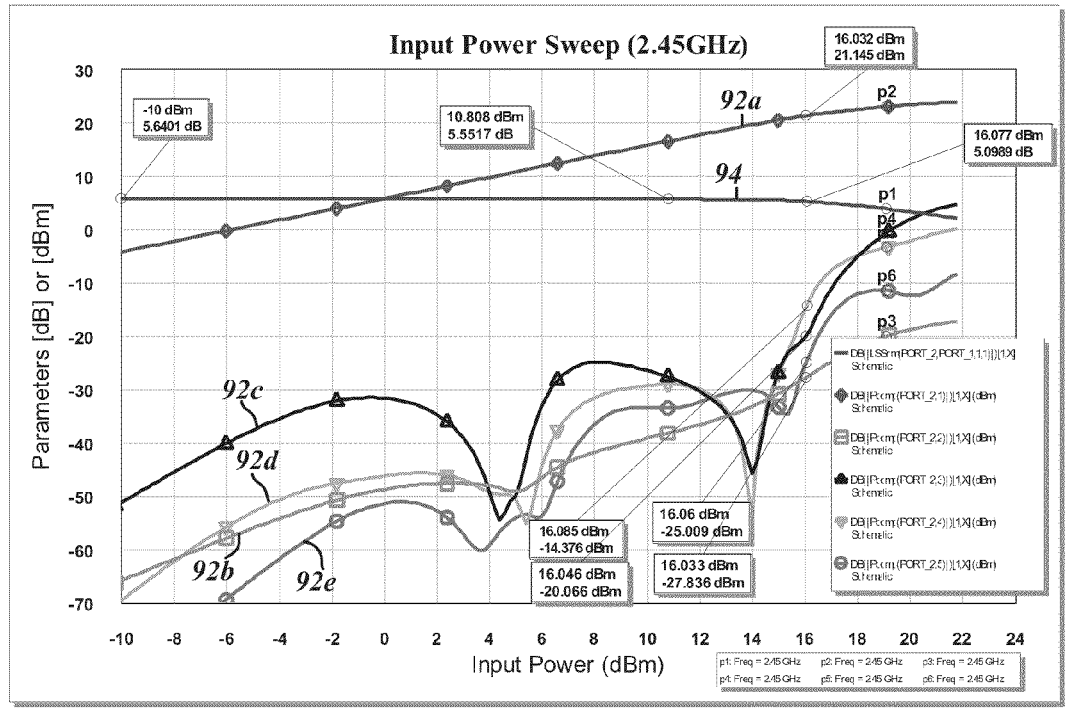
FIG. 23B is a graph showing power levels of the fundamental frequency and harmonic frequencies thereof for given input levels for the fifth embodiment of the power amplifier circuit with the second stage harmonic filter and the sixth variation of the harmonic feedback circuit as depicted in FIG. 22 under a second set of bias voltages.

FIG. 23B is a graph showing the simulated power levels of the fundamental and harmonic frequency components generated at the output port 14 of the fifth embodiment of the RF power amplifier 10e with the second variation of the harmonic feedback circuit 30b for a given input power. For this simulation, control voltage V3 has been set to 2.0V and the bias supply voltage V4 has been set to 2.3V. A first plot 92a shows the power levels of the fundamental frequency of the carrier signal, a second plot 92b shows the power levels of the second harmonic frequency, a third plot 92c shows the power levels of the third harmonic frequency, a fourth plot 92d shows the power levels of the fourth harmonic frequency, and a fifth plot 92e shows the power levels of the fifth harmonic frequency. A plot 94 shows the gain of the transistor Q1 between input and output. Relative to the same embodiment of the RF power amplifier 10e and second variation of the harmonic feedback circuit 30b but having the control voltage V3 and bias supply voltage set to 2.0V, the 2.0V and 2.3V version simulated and plotted on FIG. 23B shows additional power level reductions for all harmonic frequencies over a wide input power range.

Figure 24:
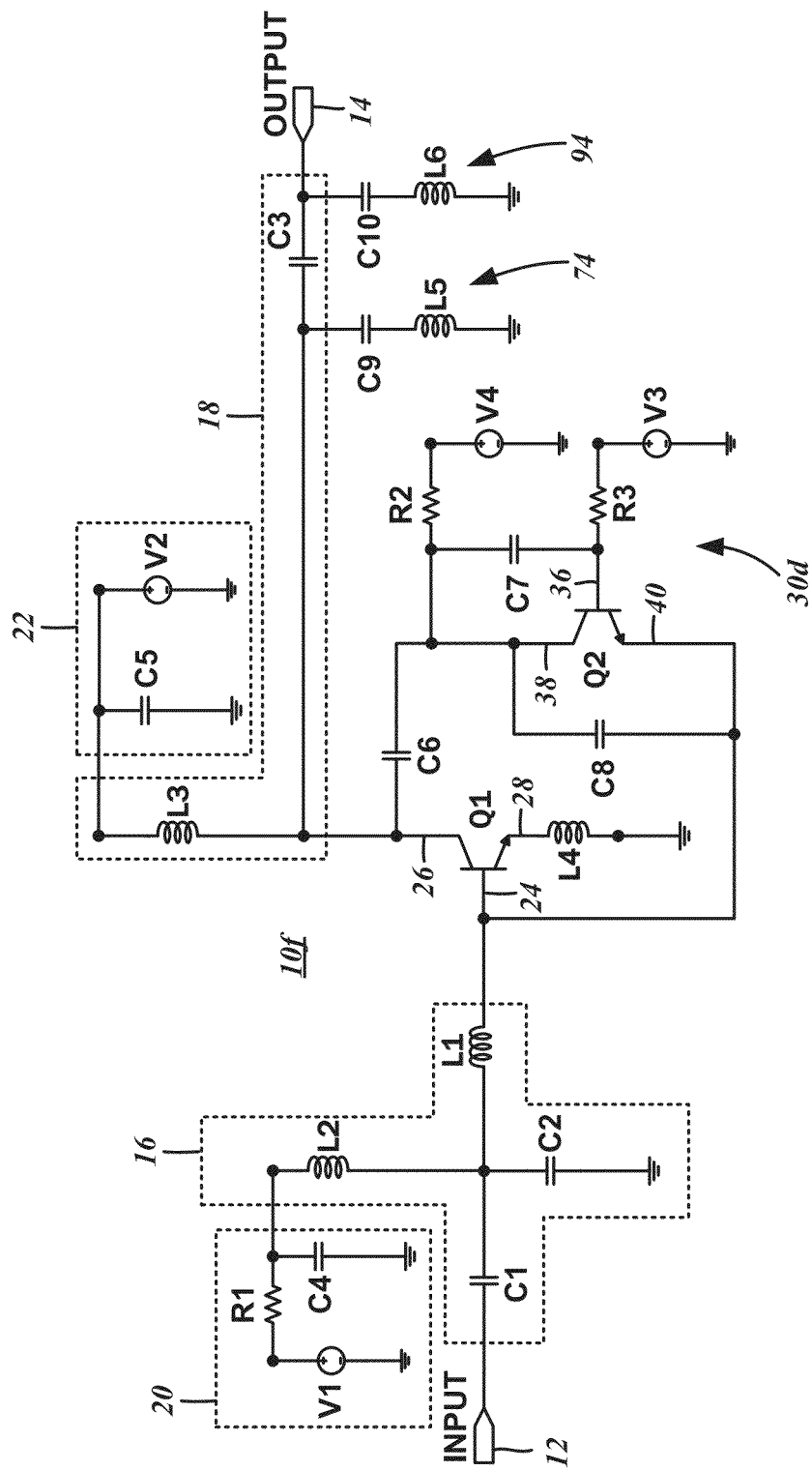
FIG. 24 is a schematic diagram of a sixth embodiment of the power amplifier circuit with the second-harmonic filter and the third-harmonic filter, and the fourth variation of the harmonic feedback circuit.

The schematic diagram of FIG. 24 illustrates a sixth embodiment of the RF power amplifier 10f that contemplates the inclusion of the aforementioned second-harmonic rejection filter 74 as well as a third-harmonic rejection filter 94 both of which become a part of the output matching network. The RF power amplifier 10f is generally defined by the input port 12 that is connected to an output of a RF transceiver (not shown), and the output port 14 that is connected to an antenna (not shown). There is the input matching circuit 16, the output matching circuit 18, the active device or transistor Q1, the base control circuit 20, and the collector bias circuit 22. The input matching circuit 16 generally includes capacitors C1 and C2, as well as inductors L1 and L2, and is connected to the input port 12 and to the base 24 of the transistor Q1. The output matching circuit 18 generally includes capacitor C3 and inductor L3, and connected to the output port 14 and to the collector 26 of the transistor Q1. The emitter 28 is tied to ground, but the inductance value of that connection is defined as L4. The base control circuit 20 is generally defined by the voltage supply V1 that is applied through resistor R1, with the capacitor C4 being used for RF bypass purposes. The collector bias circuit 22 is generally defined by the bias voltage supply V2, and again, the capacitor C5 is used for RF bypass purposes. The aforementioned second-harmonic rejection filter 74 includes the capacitor C9 and the inductor L5, both of which are tuned for series resonance at the second harmonic frequency. The aforementioned third-harmonic rejection filter 94 includes the capacitor C10 and the inductor L6, both of which are tuned for series resonance at the third harmonic frequency. These are understood to filter second harmonic signals and third harmonic signals.

The RF power amplifier 10f shown in FIG. 24 also utilizes the fourth variation of the harmonic feedback circuit 30d discussed above with reference to the schematic diagram of FIG. 15. This circuit includes the transistor Q2 with its collector 38 being connected to the collector 26 of the transistor Q1 through the capacitor C6, and its emitter 40 being connected to the base 24 of the transistor Q1. The capacitor C6 provides an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. The transistor Q2 is chosen with the appropriate geometry (size), and configured with suitable supply and control voltages to provide additional phase shift and signal shaping at the harmonic frequencies. Such supply and control voltages define the non-linear base-collector and base-emitter capacitances and resistances. The capacitor C7 is connected between the base 36 of the transistor Q2 and the collector 38 of the transistor Q2, and the capacitor C8 is connected between the collector 38 of the transistor Q2 and the emitter 40 of the transistor Q2, as well as the base 24 of the transistor Q1. The capacitors C7 and C8 are used to change the gain shaping at various harmonic frequencies. The voltage supply V3 may be either higher or lower than the voltage supply V4, though the voltage supply V3 is typically higher than the voltage supply V1 that controls the transistor Q1.

Figure 25:
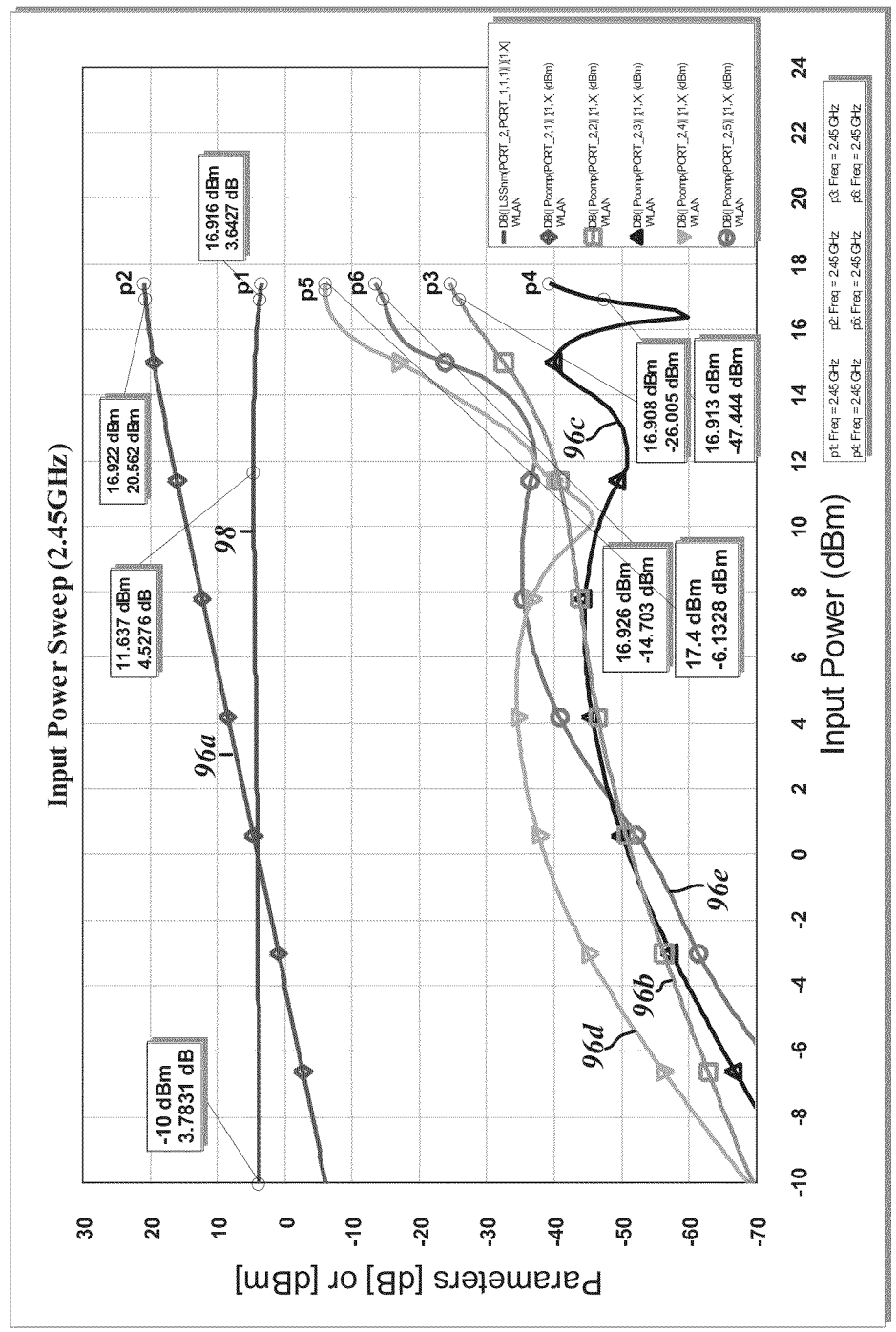
FIG. 25 is a graph showing power levels of the fundamental frequency and harmonic frequencies thereof for given input levels for the sixth embodiment of the power amplifier circuit with the second-harmonic filter and the third-harmonic filter, and the fourth variation of the harmonic feedback circuit as depicted in FIG. 24.

The graph of FIG. 25 shows the simulated power levels of the fundamental and harmonic frequency components generated at the output port 14 of the sixth embodiment of the RF power amplifier 10f with the fourth variation of the harmonic feedback circuit 30d for a given input power. A first plot 96a shows the power levels of the fundamental frequency of the carrier signal, a second plot 96b shows the power levels of the second harmonic frequency, a third plot 96c shows the power levels of the third harmonic frequency, a fourth plot 96d shows the power levels of the fourth harmonic frequency, and a fifth plot 96e shows the power levels of the fifth harmonic frequency. A plot 98 shows the gain of the transistor Q1 between input and output. In accordance with the harmonic rejection characteristics associated with the fourth variation of the harmonic feedback circuit 30d, the fourth and fifth harmonic frequencies are substantially minimized. With the inclusion of the third-harmonic rejection filter 94, 30 dB of additional reduction in the third harmonic frequency power level are possible, even without the harmonic feedback circuit 30d. Along these lines, the inclusion of the second-harmonic rejection filter 74, 30 dB of additional reduction in the second harmonic frequency power level are possible, even standing alone. Because little to none of the emissions of the second or third harmonic frequencies are being fed back to the transistor Q1, additional reduction of these harmonic frequencies by use of the harmonic feedback circuit 30d is minimal.

Figure 26:
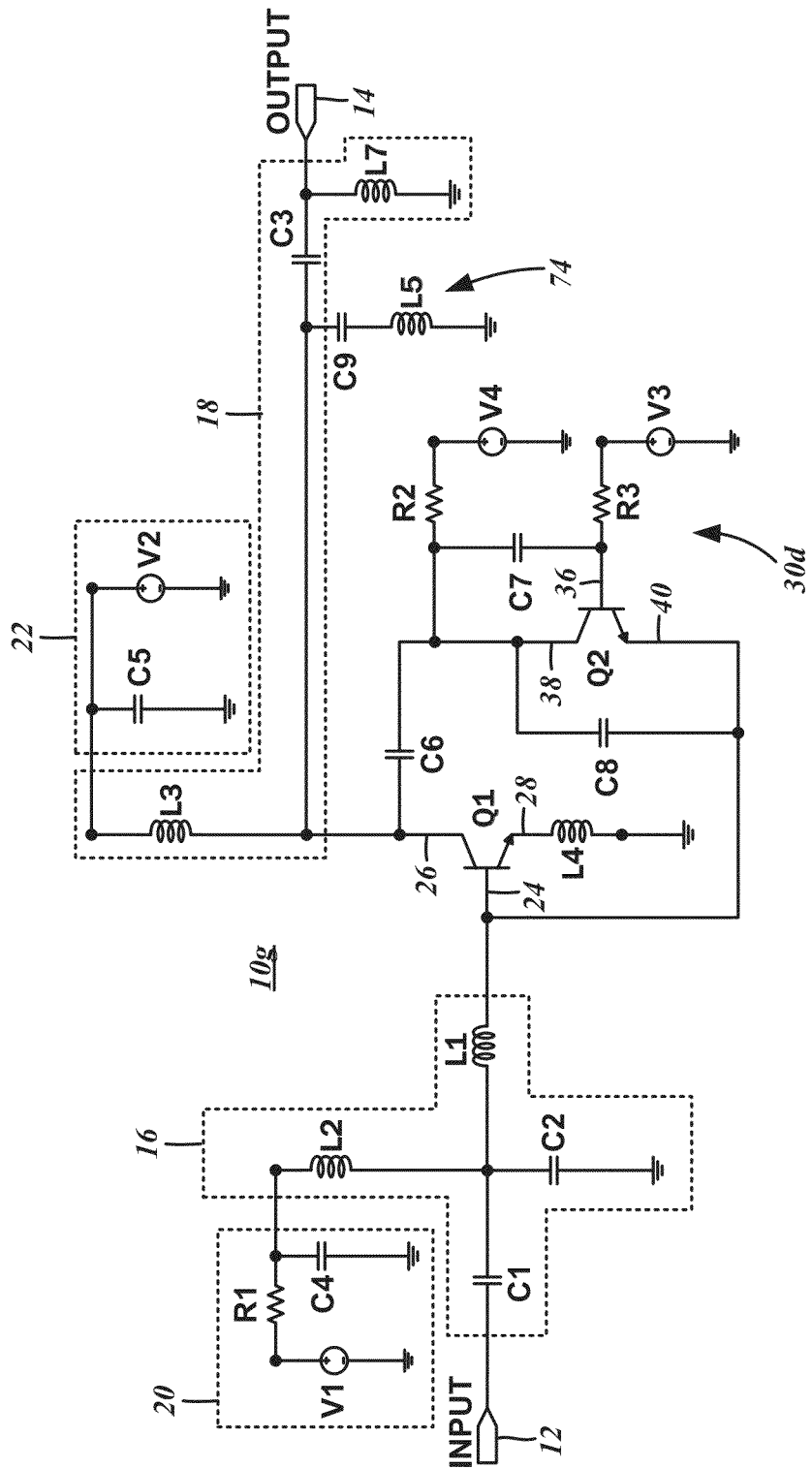
FIG. 26 is a schematic diagram of a seventh embodiment of the power amplifier circuit with a second-harmonic filter and the additional inductor for output matching at higher power levels, and the fourth variation of the harmonic feedback circuit.

FIG. 26 is a schematic diagram of a seventh embodiment of the RF power amplifier 10g including the second-harmonic rejection filter 74 and a second inductor for output matching at higher power levels. The RF power amplifier 10g is generally defined by the input port 12 connected to an output of a RF transceiver (not shown), and the output port 14 connected to an antenna (not shown). There is the input matching circuit 16, the output matching circuit 18, the active device or transistor Q1, the base control circuit 20, and the collector bias circuit 22. The input matching circuit 16 generally includes capacitors C1 and C2, as well as inductors L1 and L2, and is connected to the input port 12 and to the base 24 of the transistor Q1. The output matching circuit 18 generally includes capacitor C3 and inductor L3, as well as inductor L7 for handling increased power levels. The output matching circuit 18 is connected to the output port 14 and to the collector 26 of the transistor Q1. The emitter 28 is tied to ground, but the inductance value of that connection is defined as L4. The base control circuit 20 is generally defined by the voltage supply V1 that is applied through resistor R1, with the capacitor C4 being used for RF bypass purposes. The collector bias circuit 22 is generally defined by the bias voltage supply V2, and again, the capacitor C5 is used for RF bypass purposes. The aforementioned second-harmonic rejection filter 74 includes the capacitor C9 and the inductor L5, both of which are tuned for series resonance at the second harmonic frequency. This is understood to filter second harmonic signals.

Furthermore, this embodiment utilizes the same fourth variation of the harmonic feedback circuit 30d discussed above. Again, there is the transistor Q2 with its collector 38 connected to the collector 26 of the transistor Q1 through the capacitor C6, and its emitter 40 connected to the base 24 of the transistor Q1. The capacitor C6 provides an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. The transistor Q2 is chosen with the appropriate geometry (size), and configured with suitable supply and control voltages to provide additional phase shift and signal shaping at the harmonic frequencies. Such supply and control voltages define the non-linear base-collector and base-emitter capacitances and resistances. The capacitor C7 is connected between the base 36 of the transistor Q2 and the collector 38 of the transistor Q2, and the capacitor C8 is connected between the collector 38 of the transistor Q2 and the emitter 40 of the transistor Q2, as well as the base 24 of the transistor Q1. The capacitors C7 and C8 are used to change the gain shaping at various harmonic frequencies. The voltage supply V3 may be either higher or lower than the voltage supply V4, though the voltage supply V3 is typically higher than the voltage supply V1 that controls the transistor Q1.

Figure 27:
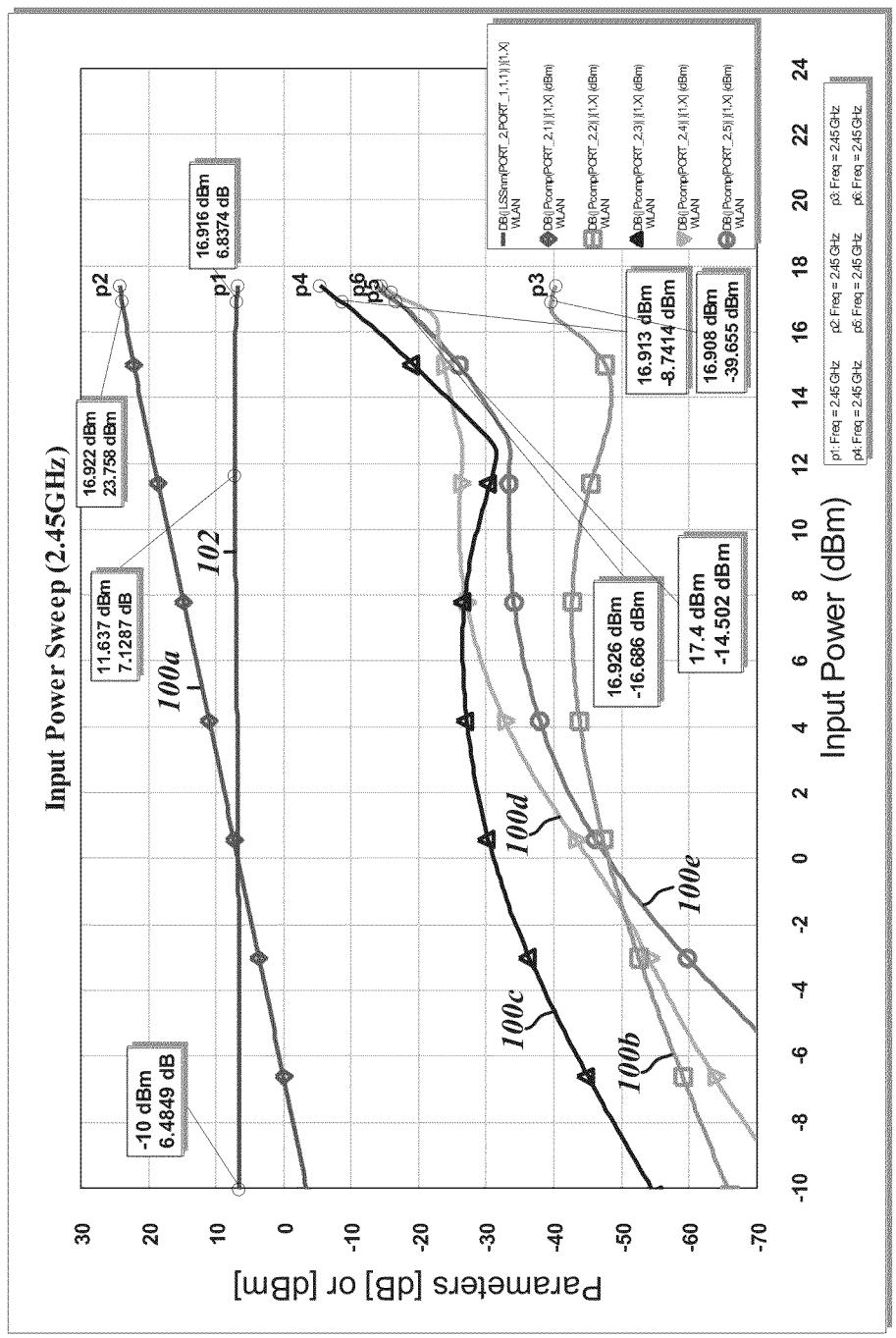
FIG. 27 is a graph showing power levels of the fundamental frequency and harmonic frequencies thereof for given input levels for the seventh embodiment of the power amplifier circuit with the second-harmonic filter and the additional inductor for output matching, and the fourth variation of the harmonic feedback circuit as depicted in FIG. 26.

The graph of FIG. 27 shows the simulated power levels of the fundamental and harmonic frequency components generated at the output port 14 of the sixth embodiment of the RF power amplifier 10g with the fourth variation of the harmonic feedback circuit 30d for a given input power. A first plot 100a shows the power levels of the fundamental frequency of the carrier signal, a second plot 100b shows the power levels of the second harmonic frequency, a third plot 100c shows the power levels of the third harmonic frequency, a fourth plot 100d shows the power levels of the fourth harmonic frequency, and a fifth plot 100e shows the power levels of the fifth harmonic frequency. A plot 102 shows the gain of the transistor Q1 between input and output. As illustrated, there is understood to be a substantial reduction in the power levels of all harmonic frequencies.

Figure 28:
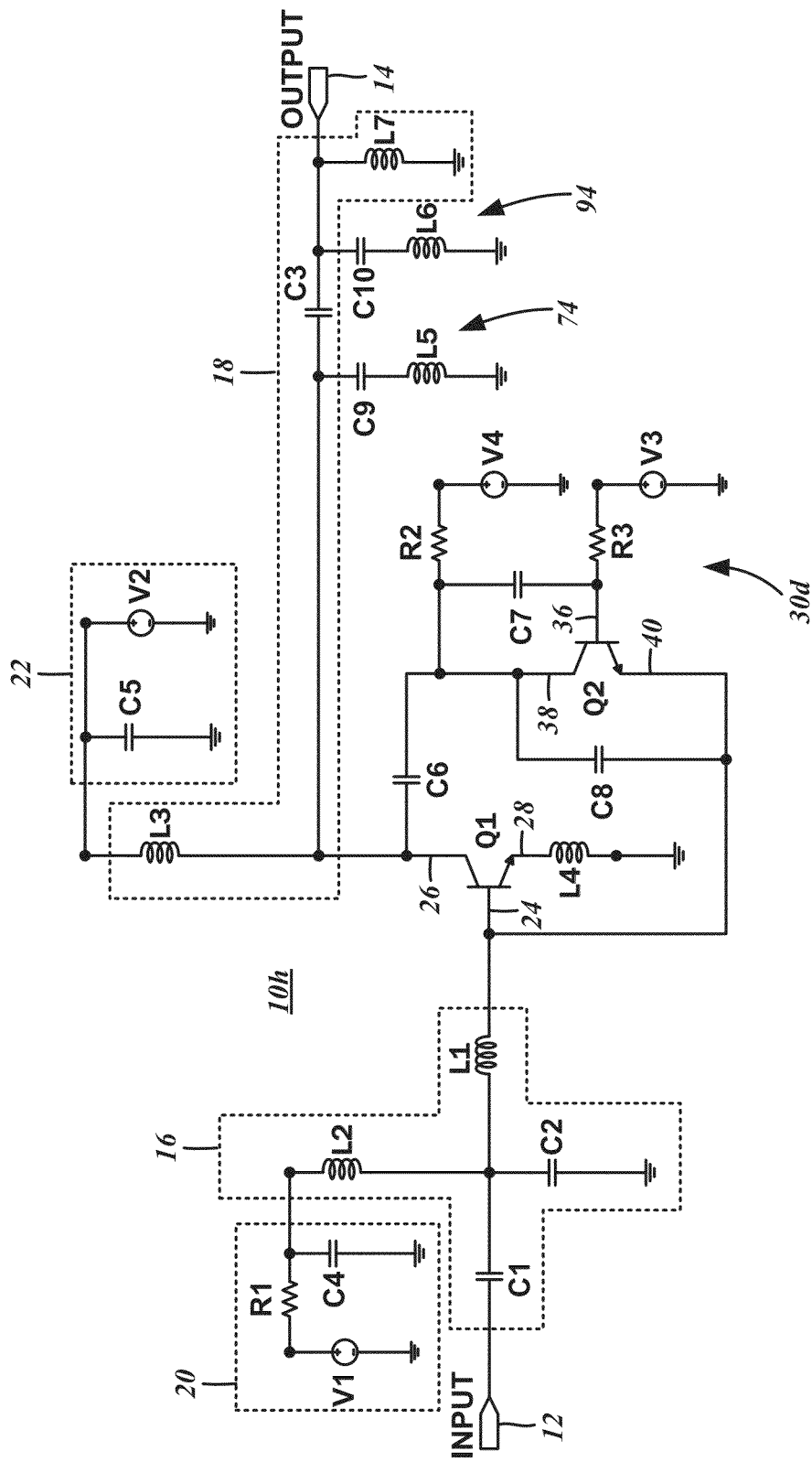
FIG. 28 is a schematic diagram of an eighth embodiment of the power amplifier circuit with the second-harmonic filter, the third-harmonic filter, and the additional inductor for output matching, and the fourth variation of the harmonic feedback circuit.

The schematic diagram of FIG. 28 illustrates an eighth embodiment of the RF power amplifier 10h that incorporates the aforementioned second-harmonic rejection filter 74, the third-harmonic rejection filter 94, and the additional inductor for output matching at higher power levels. The RF power amplifier 10h is generally defined by the input port 12 that is connected to an output of a RF transceiver (not shown), and the output port 14 that is connected to an antenna (not shown). There is the input matching circuit 16, the output matching circuit 18, the active device or transistor Q1, the base control circuit 20, and the collector bias circuit 22. The input matching circuit 16 generally includes capacitors C1 and C2, as well as inductors L1 and L2, and is connected to the input port 12 and to the base 24 of the transistor Q1. The output matching circuit 18 generally includes capacitor C3 and inductor L3, as well as inductor L7 for handling increased power levels. The output matching circuit 18 is connected to the output port 14 and to the collector 26 of the transistor Q1. The emitter 28 is tied to ground, but the inductance value of that connection is defined as L4. The base control circuit 20 is generally defined by the voltage supply V1 that is applied through resistor R1, with the capacitor C4 being used for RF bypass purposes. The collector bias circuit 22 is generally defined by the bias voltage supply V2, and again, the capacitor C5 is used for RF bypass purposes. The aforementioned second-harmonic rejection filter 74 includes the capacitor C9 and the inductor L5, both of which are tuned for series resonance at the second harmonic frequency. The aforementioned third-harmonic rejection filter 94 includes the capacitor C10 and the inductor L6, both of which are tuned for series resonance at the third harmonic frequency. These are understood to filter second harmonic signals and third harmonic signals.

This embodiment likewise utilizes the same fourth variation of the harmonic feedback circuit 30d discussed above. The circuit includes the transistor Q2, which has the collector 38 connected to the collector 26 of the transistor Q1 through the capacitor C6, and the emitter 40 connected to the base 24 of the transistor Q1. The capacitor C6 provides an appropriate phase shift of the harmonic frequency components. The collector 38 of the transistor Q2 is biased by the voltage supply V4 through resistor R2, while the base 36 of the transistor Q2 is controlled by a voltage supply V3 through resistor R3. The transistor Q2 is chosen with the appropriate geometry (size), and configured with suitable supply and control voltages to provide additional phase shift and signal shaping at the harmonic frequencies. Such supply and control voltages define the non-linear base-collector and base-emitter capacitances and resistances. The capacitor C7 is connected between the base 36 of the transistor Q2 and the collector 38 of the transistor Q2, and the capacitor C8 is connected between the collector 38 of the transistor Q2 and the emitter 40 of the transistor Q2, as well as the base 24 of the transistor Q1. The capacitors C7 and C8 are used to change the gain shaping at various harmonic frequencies. The voltage supply V3 may be either higher or lower than the voltage supply V4, though the voltage supply V3 is typically higher than the voltage supply V1 that controls the transistor Q1.

Figure 29:
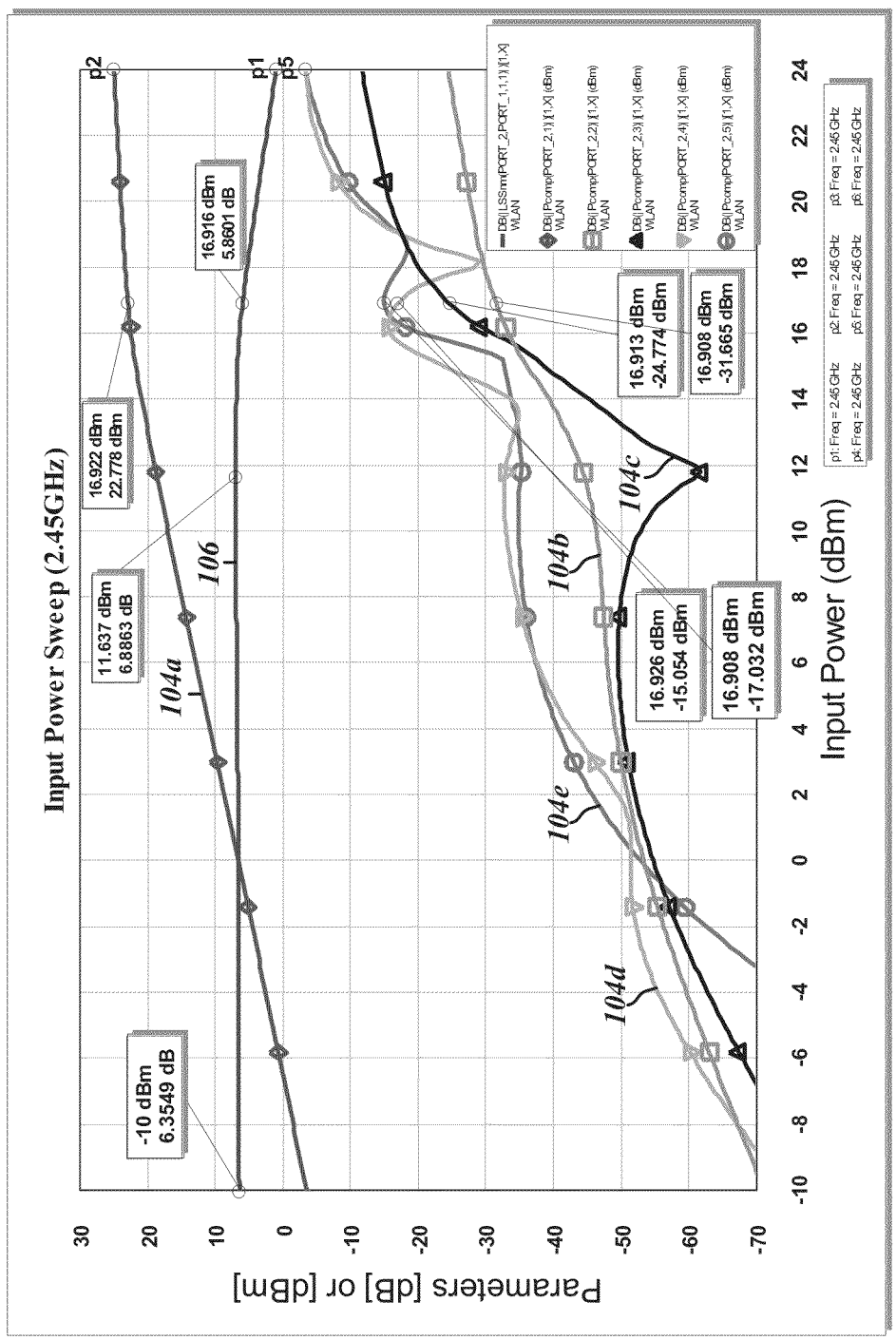
FIG. 29 is a graph showing power levels of the fundamental frequency and harmonic frequencies thereof for given input levels for the eighth embodiment of the power amplifier circuit with the second-harmonic filter, the third-harmonic filter, and the additional inductor for output matching, and the fourth variation of the harmonic feedback circuit.

The graph of FIG. 29 shows the simulated power levels of the fundamental and harmonic frequency components generated at the output port 14 of the sixth embodiment of the RF power amplifier 10h with the fourth variation of the harmonic feedback circuit 30d for a given input power. A first plot 104a shows the power levels of the fundamental frequency of the carrier signal, a second plot 104b shows the power levels of the second harmonic frequency, a third plot 104c shows the power levels of the third harmonic frequency, a fourth plot 104d shows the power levels of the fourth harmonic frequency, and a fifth plot 104e shows the power levels of the fifth harmonic frequency. A plot 106 shows the gain of the transistor Q1 between input and output. As illustrated, there is understood to be a substantial reduction in the power levels of the third, fourth, and fifth harmonic frequencies across a wide input power range, though a slight degradation in the second harmonic frequency rejection has been exhibited.

In each of the above-described embodiments of the RF power amplifier 10, each of the components thereof, including the harmonic feedback circuit 30, may be implemented on a single semiconductor die. Because there is no requirement that additional printed on-die inductors be utilized to achieve the harmonic reduction features contemplated in the present disclosure, the overall footprint of the die can be reduced, along with a concomitant reduction in cost.

The particulars shown herein are by way of example and for purposes of illustrative discussion of the embodiments of the present disclosure only and are presented in the cause of providing what is believed to be the most useful and readily understood description of the principles and conceptual aspects thereof. In this regard, no attempt is made to show details of the various embodiments with more particularity than is necessary for the fundamental understanding of the present disclosure, the description taken with the drawings making apparent to those skilled in the art how the several forms may be embodied in practice.

What is claimed is:

1. A power amplifier architecture for connecting a transceiver generating a radio frequency (RF) signal defined by a carrier fundamental frequency to an antenna including an input port and an output port comprising:
    an input matching circuit connected to the input port;
    an output matching circuit connected to the output port;
    an amplifier circuit including at least one amplifier active device with a first terminal connected to the input matching segment and a second terminal connected to the output matching segment; and
    a first harmonic feedback circuit connected across the amplifier active device, voltage components of emissions of one or more harmonic frequencies of the carrier fundamental frequency generated by the amplifier active device being fed back with opposite phase to the first terminal of the amplifier active device by the first harmonic feedback circuit;
    wherein a negative feedback at a level correlated with a gain level of the amplifier active device at the one or more harmonic frequencies of the carrier fundamental frequency is defined, and the negative feedback is minimized at the carrier fundamental frequency.

2. The power amplifier architecture of claim 1, wherein the first harmonic feedback circuit is connected to the first terminal of the amplifier active device and the second terminal of the amplifier active device.

3. The power amplifier architecture of claim 2, wherein the amplifier active device has a third terminal.

4. The power amplifier architecture of claim 3, wherein the first harmonic feedback circuit is connected to the second terminal of the amplifier active device and the third terminal of the amplifier active device.

5. The power amplifier architecture of claim 3, further comprising:
    coupled inductors connected to a respective one of the third terminal of the amplifier active device and the first harmonic feedback circuit;
    wherein the first harmonic feedback circuit is further connected to the second terminal of the amplifier active device.

6. The power amplifier architecture of claim 3, further comprising:
    a second harmonic feedback circuit connected across the amplifier active device, the voltage components of emissions of one or more harmonic frequencies of the carrier fundamental frequency generated by the amplifier active device being fed back with opposite phase to the first terminal of the amplifier active device by the second harmonic feedback circuit.

7. The power amplifier architecture of claim 3, wherein the amplifier active device is a bipolar type transistor defined by a base corresponding to the first terminal, a collector corresponding to the second terminal, and an emitter corresponding to the third terminal.

8. The power amplifier architecture of claim 3, wherein the amplifier active device is a field effect type transistor defined by a gate corresponding to the first terminal, a source corresponding to the second terminal, and an drain corresponding to the third terminal.

9. The power amplifier architecture of claim 3, wherein the input matching circuit, the output matching circuit, the amplifier circuit, and the first harmonic feedback circuit are fabricated on a semiconductor substrate selected from a group consisting of metal oxide semiconductor field effect, bipolar junction, heterojunction bipolar, metal semiconductor field effect, and high electron mobility.

10. The power amplifier architecture of claim 1, wherein the input matching circuit, the output matching circuit, the amplifier circuit, and the first harmonic feedback circuit are implemented on a single semiconductor die.

11. The power amplifier architecture of claim 2, wherein the first harmonic feedback circuit includes:
    a passive harmonics phase shift component;
    a control voltage source;
    a bias voltage source; and
    a first feedback active device with a first terminal connected to the control voltage source, a second terminal connected to the bias voltage source and the passive harmonics phase shift component, and a third terminal connected to the first terminal of the amplifier active device;
    wherein the first feedback active device, together with the passive harmonics phase shift component, the control voltage source, and the supply voltage source are tuned to shift the emissions of the one or more harmonic frequencies of the carrier fundamental frequency to the opposite phase.

12. The power amplifier architecture of claim 11, wherein the passive phase shift component is a capacitor.

13. The power amplifier architecture of claim 11, wherein the first harmonic feedback circuit further includes:
    a passive gain shaping component connected to the first feedback active device.

14. The power amplifier architecture of claim 13, wherein the passive gain shaping component is connected to the first terminal of the first feedback active device and the second terminal of the first feedback active device.

15. The power amplifier architecture of claim 13, wherein the passive gain shaping component is a capacitor.

16. The power amplifier architecture of claim 13, wherein:
    the control voltage source has a resistance of 300 Ohm;
    the bias voltage source has a resistance of 160 Ohm;
    the passive gain shaping component has a capacitance of 0.18 pico Farad;
    the passive harmonics phase shift component has a capacitance of 0.75 pico Farad.

17. The power amplifier architecture of claim 13, wherein the passive gain shaping component is connected to the second terminal of the first feedback active device and the third terminal of the first feedback active device.

18. The power amplifier architecture of claim 11, wherein the first harmonic feedback circuit further includes:

a first passive gain shaping component connected to the first feedback active device between the first terminal thereof and the second terminal thereof;

a second passive gain shaping component connected to the first feedback active device between the third terminal thereof and the second terminal thereof.

19. The power amplifier architecture of claim 11, wherein the first feedback active device is a bipolar type transistor defined by a base corresponding to the first terminal, a collector corresponding to the second terminal, and an emitter corresponding to the third terminal.

20. The power amplifier architecture of claim 11, wherein the first feedback active device is a field effect type transistor defined by a gate corresponding to the first terminal, a source corresponding to the second terminal, and an drain corresponding to the third terminal.

21. The power amplifier architecture of claim 11, wherein the first feedback active device is a bipolar type transistor defined by a base corresponding to the first terminal, an emitter corresponding to the second terminal, and an collector corresponding to the third terminal.

22. The power amplifier architecture of claim 1, further comprising:

a second-harmonic rejection filter connected to the second terminal of the amplifier active device and tuned for series resonance at a second harmonic frequency of the carrier fundamental frequency generated by the amplifier active device.

23. The power amplifier architecture of claim 22, wherein first harmonic feedback circuit includes:

a passive harmonics phase shift component;
a control voltage source;
a bias voltage source;
a first feedback active device with a first terminal connected to the control voltage source, a second terminal connected to the bias voltage source and the passive harmonics phase shift component, and a third terminal connected to the first terminal of the amplifier active device;
a first passive gain shaping component connected to the first terminal of the first feedback active device and the second terminal of the first feedback active device; and
a second passive gain shaping component connected to the third terminal of the first feedback active device and the second terminal of the first feedback active device;
wherein the first feedback active device, together with the passive harmonics phase shift component, the control voltage source, and the supply voltage source are tuned to shift the emissions of the one or more harmonic frequencies of the carrier fundamental frequency to the opposite phase.

24. The power amplifier architecture of claim 22, wherein first harmonic feedback circuit includes:

a passive harmonics phase shift component;
a control voltage source;
a bias voltage source;
a first feedback active device with a first terminal connected to the control voltage source, a second terminal connected to the bias voltage source and the passive harmonics phase shift component, and a third terminal;
a passive gain shaping component connected to the first terminal of the first feedback active device and the second terminal of the first feedback active device;
a second feedback active device with a first terminal, a second terminal, and a third terminal, the first terminal of the second feedback active device being connected to the third terminal of the first feedback active device and the second terminal of the second feedback active device being connected to the second terminal of the first feedback active device in a Darlington configuration, and the third terminal of the second feedback active device being connected to the first terminal of the amplifier active device;
wherein the first feedback active device, together with the passive harmonics phase shift component, the control voltage source, and the supply voltage source are tuned to shift the emissions of the one or more harmonic frequencies of the carrier fundamental frequency to the opposite phase.

25. The power amplifier architecture of claim 22, further comprising:

a third-harmonic rejection filter connected to the output port and tuned for series resonance at a third harmonic frequency of the carrier fundamental frequency generated by the amplifier active device.

26. The power amplifier architecture of claim 25, wherein first harmonic feedback circuit includes:

a passive harmonics phase shift component;
a control voltage source;
a bias voltage source; and
a first feedback active device with a first terminal connected to the control voltage source, a second terminal connected to the bias voltage source and the passive harmonics phase shift component, and a third terminal connected to the first terminal of the amplifier active device;
a first passive gain shaping component connected across the first feedback active device between the first terminal thereof and the second terminal thereof;
a second passive gain shaping component connected across the first feedback active device between the third terminal thereof and the second terminal thereof
wherein the first feedback active device, together with the passive harmonics phase shift component, the control voltage source, and the supply voltage source are tuned to shift the emissions of the one or more harmonic frequencies of the carrier fundamental frequency to the opposite phase.

27. The power amplifier architecture of claim 25, wherein the output matching circuit is an inductor-capacitor (LC) network, and including a secondary inductor connected to the output port.

28. The power amplifier architecture of claim 22, wherein first harmonic feedback circuit includes:

a passive harmonics phase shift component;
a control voltage source;
a bias voltage source;
a first feedback active device with a first terminal connected to the control voltage source, a second terminal connected to the bias voltage source and the passive harmonics phase shift component, and a third terminal connected to the first terminal of the amplifier active device;
a first passive gain shaping component connected to the first terminal of the first feedback active device and the second terminal of the first feedback active device; and
a second passive gain shaping component connected across the first feedback active device between the third terminal thereof and the second terminal thereof;
wherein the first feedback active device, together with the passive harmonics phase shift component, the control voltage source, and the supply voltage source are tuned to shift the emissions of the one or more harmonic frequencies of the carrier fundamental frequency to the opposite phase.

29. The power amplifier architecture of claim 28, wherein the output matching circuit is an inductor-capacitor (LC) network, and including a secondary inductor connected to the output port.

* * * * *